United States Patent [19]
Skogby

[11] Patent Number: 6,134,515
[45] Date of Patent: Oct. 17, 2000

[54] CONTROLLING A FIRST TYPE TELECOMMUNICATIONS SWITCH UPON TRANSLATING INSTRUCTIONS FOR A SECOND TYPE TELECOMMUNICATIONS SWITCH

[75] Inventor: Staffan Skogby, Danderyd, Sweden

[73] Assignee: Telefonaktiebolaget LM Ericsson, Stockholm, Sweden

[21] Appl. No.: 09/016,355

[22] Filed: Jan. 30, 1998

Related U.S. Application Data

[63] Continuation-in-part of application No. 08/887,653, Jul. 3, 1997, Pat. No. 5,946,474, which is a continuation-in-part of application No. 08/874,660, Jun. 13, 1997.

[51] Int. Cl.$^7$ .................................................. G06F 9/455
[52] U.S. Cl. ............................... 703/23; 703/20; 703/21; 379/9; 379/10; 379/15
[58] Field of Search ............................ 395/500.44, 527; 340/825.06, 825.07; 370/351, 352, 401, 466, 467, 328; 379/9, 10, 15; 703/20, 21, 23

[56] References Cited

U.S. PATENT DOCUMENTS

| | | |
|---|---|---|
| 3,698,007 | 10/1972 | Malcolm et al. . |
| 4,908,821 | 3/1990 | Sirato . |
| 5,101,491 | 3/1992 | Katzeff . |

(List continued on next page.)

FOREIGN PATENT DOCUMENTS

| | | |
|---|---|---|
| WO 88 07718 | 10/1988 | WIPO . |
| WO 94 27215 | 10/1988 | WIPO . |

OTHER PUBLICATIONS

May, "Mimic: A Fast System/370 Simulator", Proceedings of the Object Oriented Programming Systems Languages an Applications Conference, (OOPSLA), Orlando, Oct. 4–8, 1987, Special Issue of Sigplan Notices, vol. 22, No. 12, Dec. 1987, vol. 22, No. 7, Jun. 24, 1987.

Kluth et al, "Efficient Simulation of Network Models in C++", Teletraffic and Datatraffic in a Period of Change, Compenhagen, Jun. 19–26, 1991, pp. 601–608.

Cohen et al, "Generic Simulation Models of Communication Systems", Proceedings of the 29th Annual Simulation Symposium (Cat. No. 96TB100039), Proceedings of the 29th Ann. Simulation Symposium, New Orleans, LA, Apr. 8–11, 1996, IEEE Comput. Soc. Pres., pp. 81–88, XP002061052.

Anderson, "An Overview of Motorola's Power Simulator Family", Communications of the Association for Computing Machinery, vol. 37, No. 6, Jun. 1, 1994, pp. 64–69, XP000450283.

(List continued on next page.)

*Primary Examiner*—Kevin J. Teska
*Assistant Examiner*—Lonnie A. Knox
*Attorney, Agent, or Firm*—Nixon & Vanderhye, P.C.

[57] ABSTRACT

A telecommunications exchange comprises a switching device (1201) of a first type through which telecommunications connections are routed. An access unit (1202) connects the switching device to a telecommunications network. The telecommunications exchange includes an exchange main processor (1200) which generates switch control messages for a switching device of a second type but which translates the switch control messages for use by the switching device of the first type. Preferably, the switching device of the second type is a group switch, and the exchange main processor is an open platform processor. The exchange main processor emulates portions of a telecommunications exchange which control the switching device of the first type the emulated portions including a central processor (1234), regional processors, and a switching subsystem (1230). In emulating the central processor, the exchange main processor advantageously enables utilization of previously developed logic for telecommunications exchanges using the second switching device by translating coded instructions executable by the central processor into instructions executable by exchange main processor.

51 Claims, 16 Drawing Sheets

U.S. PATENT DOCUMENTS

| | | |
|---|---|---|
| 5,233,628 | 8/1993 | Rappaport et al. . |
| 5,406,644 | 4/1995 | MacGregor . |
| 5,465,361 | 11/1995 | Hoenninger, III . |
| 5,488,569 | 1/1996 | Kaplan et al. . |
| 5,502,826 | 3/1996 | Vassiliadis et al. . |
| 5,546,450 | 8/1996 | Suthard et al. ......................... 379/207 |
| 5,574,873 | 11/1996 | Davidian ................................ 712/200 |
| 5,613,098 | 3/1997 | Landau et al. . |
| 5,621,670 | 4/1997 | Maeda et al. . |
| 5,671,355 | 9/1997 | Collins .................................... 709/250 |
| 5,774,695 | 6/1998 | Autrey et al. ...................... 395/500.47 |
| 5,786,770 | 7/1998 | Thompson ........................ 340/825.06 |
| 5,852,660 | 12/1998 | Lindquist et al. ....................... 379/230 |
| 5,867,689 | 2/1999 | McLain, Jr. .............................. 395/500 |
| 5,946,474 | 8/1999 | Skogby ............................... 395/500.44 |
| 5,959,988 | 9/1999 | Bjorkman et al. ...................... 370/389 |
| 5,960,004 | 9/1999 | Ramstrom et al. ..................... 370/469 |

OTHER PUBLICATIONS

Luderer, et al, "A Research Testbed for Switching Software Studies", Proceedings of the Global Communications Conference (Globecom), Houston, Nov. 29–Dec. 2, 1993, vol. 2, pp. 1034–1038, Institute of Electrical and Electronics Engineers XP000427963.

Cohen and Mrabet, Generic simulation Models of Communication Systems, 1996, Proceedings of Simulation pp. 81–88.

Cohen and Mrabiet, Function–Based Methodology to Model Communication Protocols for Perofrmanceevaluation, 1994, Singapore ICCS/'94, pp. 90–94.

Fraser et al., XUNET 2: A Nationwide Testbed in High–Speed Networking, 1992, Infocom '92, pp. 4D.2.1–8.

Luderer and Bhandari, A Reasearch Testbed for Switching Software Studies, 1993, IEEE 0–7803–0917–0/93, pp.1034–1038.

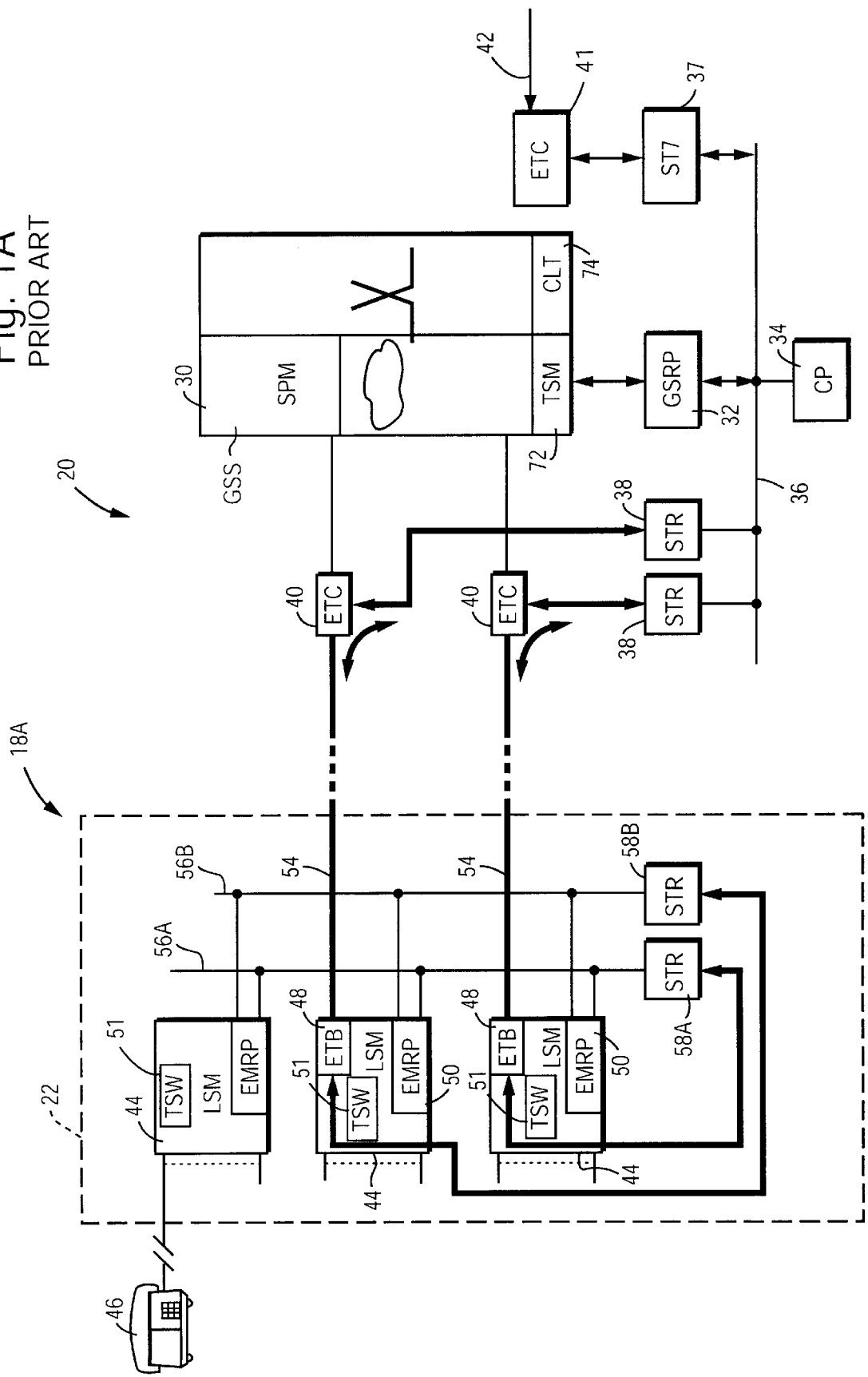

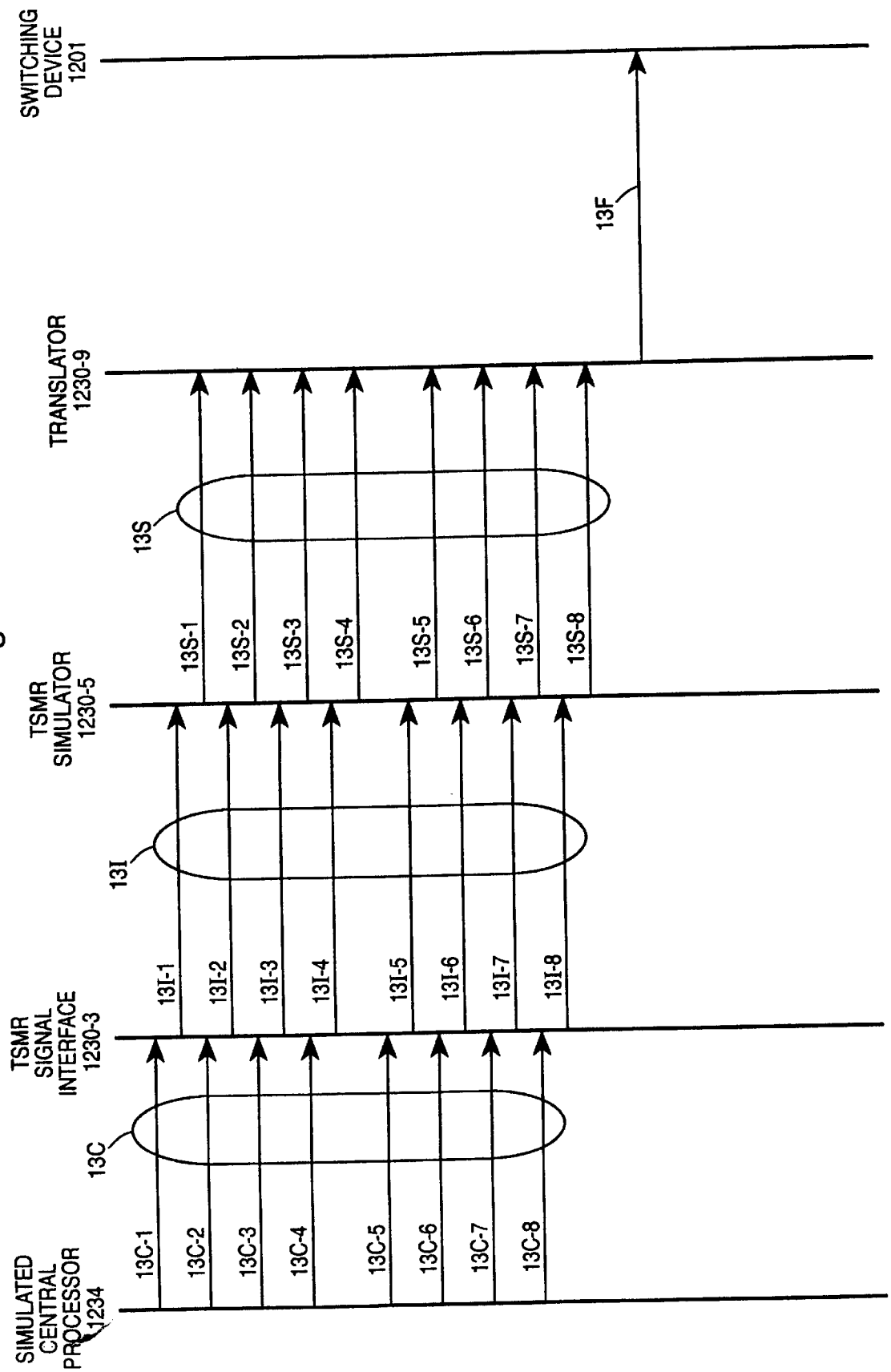

6,134,515

CONTROLLING A FIRST TYPE TELECOMMUNICATIONS SWITCH UPON TRANSLATING INSTRUCTIONS FOR A SECOND TYPE TELECOMMUNICATIONS SWITCH

This application is a continuation-in-part of U.S. patent application Ser. No. 08/887,653, filed Jul. 3, 1997 now U.S. Pat. No. 5,946,474 and entitled "SIMULATION OF COMPUTER-BASED TELECOMMUNICATIONS SYSTEM", which in turn is a continuation-in-part of U.S. patent application Ser. No. 08/874,660, filed Jun. 13, 1997 and entitled "SIMULATION OF COMPUTER PROCESSOR", both of which are incorporated herein by reference.

BACKGROUND

1. Field of the Invention

The present invention pertains to telecommunications, and particularly to a telecommunications exchange.

2. Related Art and other Considerations

Subscribers to telecommunications services are connected to one another through one or more networks so that a connection, e.g., a telephone call or data transmission, for example, can be made between the subscribers. The networks including various nodes or exchanges through which the connection is routed. In this regard each subscriber is connected by land lines to a local exchange, with local exchanges being connected together when necessary (via land lines) by one or more transit exchanges. Each local exchange and transit exchange typically has a large and complex switch through which connections are routed between incoming and outgoing lines.

One example of a traditional switch utilized for telephone exchanges is known as the group switch, such as the AXE Group Switch of Telefonaktiebolaget L. M. Ericsson. A group switch typically includes both space switch modules and time switch modules in a switch core, as well as group switch software. The entire exchange including the group switch is under the control of a central processor and plural regional processors. The central processor and regional processors execute the group switch software as well as other software for the exchange. The group switch further has special hardware for forming connections to line switch modules for handling traffic and signaling. The line switch modules are ultimately connected outside of the exchange, e.g., to the subscribers Even the smallest group switch generally can handle several thousand connections.

Telephone exchanges which include group switches are complex and expensive. The complexity and expense result at least in part from dedicated hardware components employed in the exchange, as well from the size of the group switch itself. In addition, the central processor is a customized processor which is considerably more expensive than industry standard processors.

Since telephone exchanges are complex, much effort has been expended in the development and testing of a suitable operating system for use by the central processor of the telephone exchanges. For example, for the AXE Group Switch a specialized operating system known as the APZ has been developed for coordinating practically all aspects of a telephone exchange. The operating system of the AXE Group Switch executes an APZ customized instruction set. Reflecting the complex nature of the group switch itself, the operating system is highly developed and intricate.

Some environments do not justify the capacity or cost of telephone exchange with a large group switch. For example, in rural or less populated regions, there are not a great number of subscribers for whom telephonic switching operations need to be performed. Furthermore, in some developing countries of the world, modest resources require that telephone switching be implemented on a smaller scale. However, these environments could someday have a potential need for greater switching capacity.

What is needed, therefore, is a telecommunications exchange which inexpensively implements simplified but potentially upgradable switching devices.

BRIEF SUMMARY OF THE INVENTION

A telecommunications exchange comprises a switching device of a first type through which telecommunications connections are routed. An access unit connects the switching device to a telecommunications network. The telecommunications exchange includes an exchange main processor, also known as the exchange simulation processor, which generates switch control messages for a switching device of a second type but which translates the switch control messages for use by the switching device of the first type. Preferably, the switching device of the second type is a group switch, and the exchange main processor is an open platform processor.

The exchange main processor emulates portions of a telecommunications exchange which control the switching device of the first type, the emulated portions including a central processor, regional processors, and a switching subsystem. In emulating the central processor, the exchange main processor advantageously enables utilization of previously developed logic for telecommunications exchanges using the second switching device by translating coded instructions executable by the central processor into instructions executable by exchange main processor.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 1A is a schematic view of a telephone switching system including a remote subscriber stage.

FIG. 13 is a diagrammatic view showing the handling of switch control messages from a simulated central processor and through a simulated group switch subsystem (SGS) to a switching device according to a mode of the invention.

DETAILED DESCRIPTION OF THE DRAWINGS

Figure 1B:
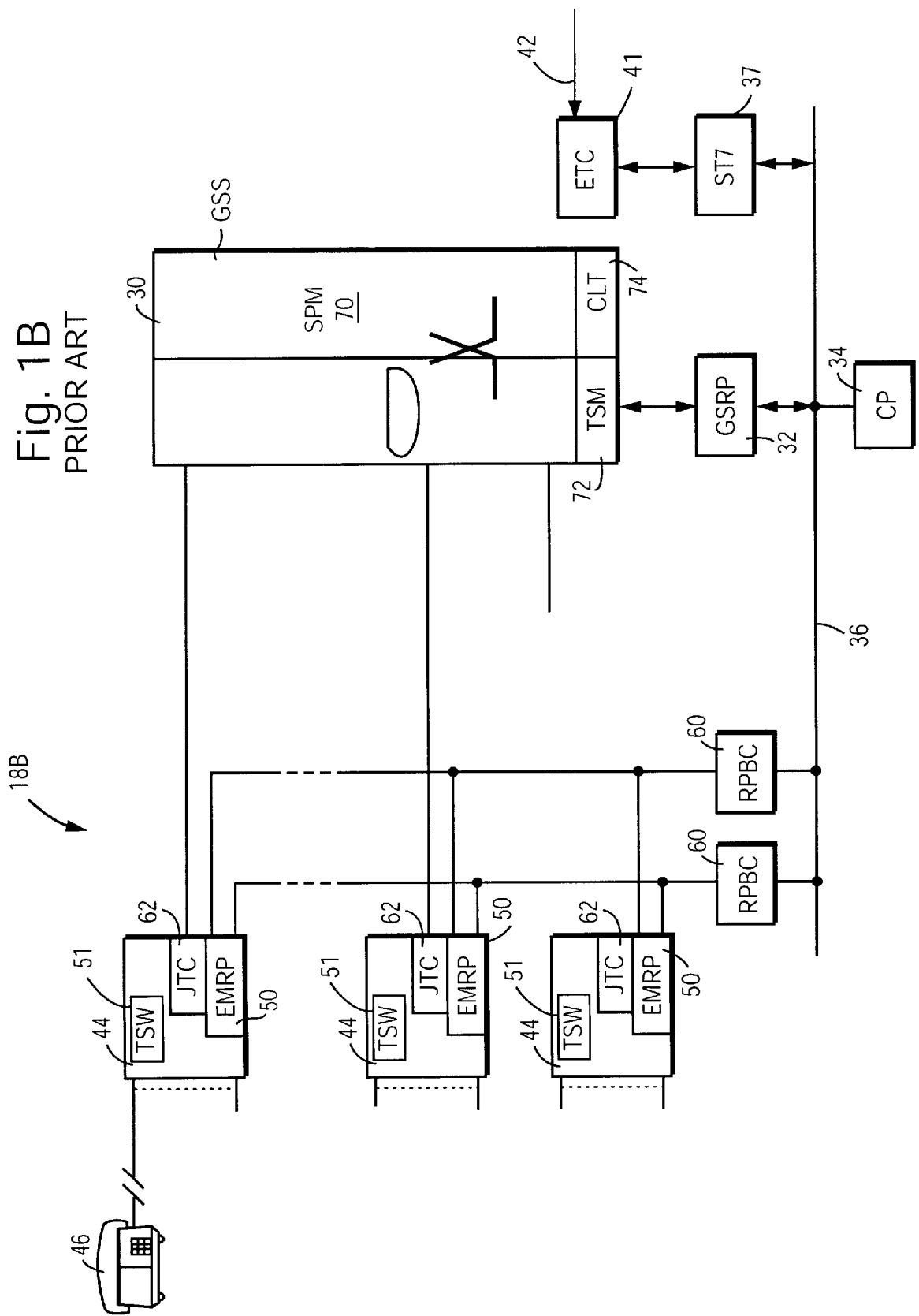
FIG. 1B is a schematic view of a telephone switching system wherein a subscriber stage is included in a parent exchange.

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well known devices, circuits, and methods are omitted so as not to obscure the description of the present invention with unnecessary detail.

The present invention provides a telecommunications exchange in which a traditional group switch is replaced with another switching device. The replacement switching device itself connects essentially directly to access units (e.g., access modules and trunk lines), and includes switch logic. In addition to the replacement switching device and the access units, the telecommunications exchange of the present invention includes an exchange main processor which implements substantially the remainder of the telecommunications exchange. The exchange main processor, which can be an industry standard processor, simulates the processors and various subsystems of an traditional telecommunications exchange which employs a group switch. The exchange main processor additionally provides adaptation functionality (including interfacing and translating) which enables the exchange computer to communicate with the replacement switching device. Advantageously, in simulating the central processor and regional processors of the traditional telecommunications exchange, the exchange main processor translates blocks of code written in the instruction set of the operating system of the traditional telecommunications exchange into code executable by the exchange main processor as the exchange computer performs the simulation.

Prior to describing the present invention, an overview is provided of two embodiments of a traditional telecommunications exchange which utilizes a group switch.

1.0 Conventional Exchanges With Group Switches

FIG. 1A shows a telephone switching system 18A including a local telephone exchange 20 connected to a remote subscriber switch (RSS) 22. Exchange 20 includes group switching subsystem (GSS) 30. Group switching subsystem (GSS) 30 is controlled by one or more group switch regional processors (GSRP) 32, which in turn is controlled by central processor (CP) 34. Central processor (CP) 34 and group switch regional processor(s) [GRSP] 32 communicate over a regional processor bus (RPB) 36. Other regional processors, a signaling terminal 37 for signaling system No. 7, and other signaling terminal centrals (STC) 38 are also connected to regional processor bus (RPB) 36. As illustrated in FIG. 1A, each signaling terminal central (STC) 38 is connected to an associated exchange terminal circuit (ETC) 40. The signaling terminal 37 for signaling system No. 7 is connected to an associated exchange terminal circuit (ETC) 41. Exchange terminal circuit (ETC) 41 is connected to other switches by a link 42.

Remote subscriber switch (RSS) 22 includes a plurality of line switch modules (LSMs) 44, each of the line switch modules (LSM) 44 being connected to a plurality of subscribers such as subscriber 46. The line switch modules (LSMs) 44 include numerous components. At least one, and preferably a plurality (but not necessarily all) of the line switch modules (LSMs) 44 have an exchange terminal board (ETB) 48. Each line switch module (LSM) 44 has an extension module regional processor (EMRP) 50 and a time switch (TSW) 51. Each exchange terminal board (ETB) 48 is connected by links through one of the exchange terminal circuits (ETCs) 40 to a port of group switch (GSS) 30. The extension module regional processors (EMRPs) 50 are connected to two separate EMRP buses 56A and 56B. EMRP bus 56A is connected also to a signaling terminal remote (STR) 58A; EMRP bus 56B is connected also to a signaling terminal remote (STR) 58B. The signaling terminal remotes (STRs) 58 are connected to the exchange terminal boards (ETBs) 48 in the remote subscriber switch (RSS) 22.

A call between subscribers, also referred to as a connection, is routed through the telephone switching system 18. A call typically includes both signaling and traffic (the subscriber's message, e.g., voice or data). A call or connection utilizes channels, e.g., time division slots, on the links 54, of which channel 16 is typically designated for common channel signaling.

FIG. 1B shows a telephone switching system 18B in which a subscriber stage is included in the parent exchange. Like the system 18B of FIG. 1A, telephone switching system 18B includes a group switch subsystem (GSS) 30 which is controlled by group switch regional processor(s) [GSRP] 32, which in turn communicates with central processor (CP) 34 over regional processor bus (RPB) 36. Telephone switching system 18B of FIG. 1B differs from that of FIG. 1A in that each pair of signaling terminal centrals (STCs) 38 and exchange terminal boards (ETBs) 40 are combined to form a regional processor bus converter (RPBC) 60. The regional processor bus converters (RPBCs)

60 are connected both to regional processor bus (RPB) 36 and to the line switch modules (LSM) 44. In addition, the exchange terminal board (ETB) in each line switch module (LSM) 44 is replaced by a printed circuit board assembly known as a junctor terminal circuit (JTC) 62.

The group switch subsystem (GSS) 30 comprises a plurality of space switch modules collectively referred to herein as the space switch module (SPM) 70. Each row of space switch modules is controlled by a time switch module, there being a plurality of time switch modules (one for each row) collectively designated as time switch module (TSM) 72.

When connection signaling indicates that a call is to be set up in the group switch subsystem (GSS) 30, the group switch regional processor (GSRP) 32 selects the path through the group switch subsystem (GSS) 30 to be utilized for the connection by writing information to a control store of an appropriate one of the time switch modules. For synchronization of the group switch subsystem (GSS) 30, a plurality of clock modules, collectively referenced as clock modules CLT 74, are employed.

The signaling which is utilized to set up, route, and terminate the subscriber content information (i.e., traffic) through a network is referred to herein as "connection signaling". Connection signaling is typically one of two types: channel associated signaling (CAS) or common channel signaling (CCS). Such connection signaling is not to be confused with program signaling (e.g., software instructions) which is used in and between two or more processors to control the various functions of the exchanges per se.

In the telephone switching systems of FIG. 1A and FIG. 1B it is necessary for the central processor (CP) 34 to communicate with the extension module regional processors (EMRPs) 50 included in the line switch modules (LSMs) 44. Central processor (CP) 34 communicates with the extension module regional processors (EMRPs) 50 using program signals. These program signals are included as part of the information carried in the connection switching channels. That is, in the embodiment of FIG. 1A, the communication between central processor (CP) 34 and the extension module regional processors (EMRPs) 50 occurs in the connection signaling between signaling terminal central (STC) 38 and exchange terminal board (ETB) 48 (which is routed through exchange terminal circuit (ETC) 40), with exchange terminal board (ETB) 48 being connected to a signaling terminal remote (STR) 58. Each signaling terminal remote (STR) 58 is, in turn, connected to all extension module regional processors (EMRPs) 50. In the embodiment of FIG. 1B, each regional processor bus converter (RPBC) 60 is connected to all extension module regional processors (EMRPs) 50.

The architecture of the telephone switching systems of FIG. 1A and FIG. 1B is understood by the person skilled in the art. Other examples of such architecture are described in U.S. patent application Ser. No. 08/601,964, filed Feb. 15, 1996, entitled "TELECOMMUNICATIONS SWITCHING EXCHANGE", which is incorporated herein by reference.

Figure 1C:
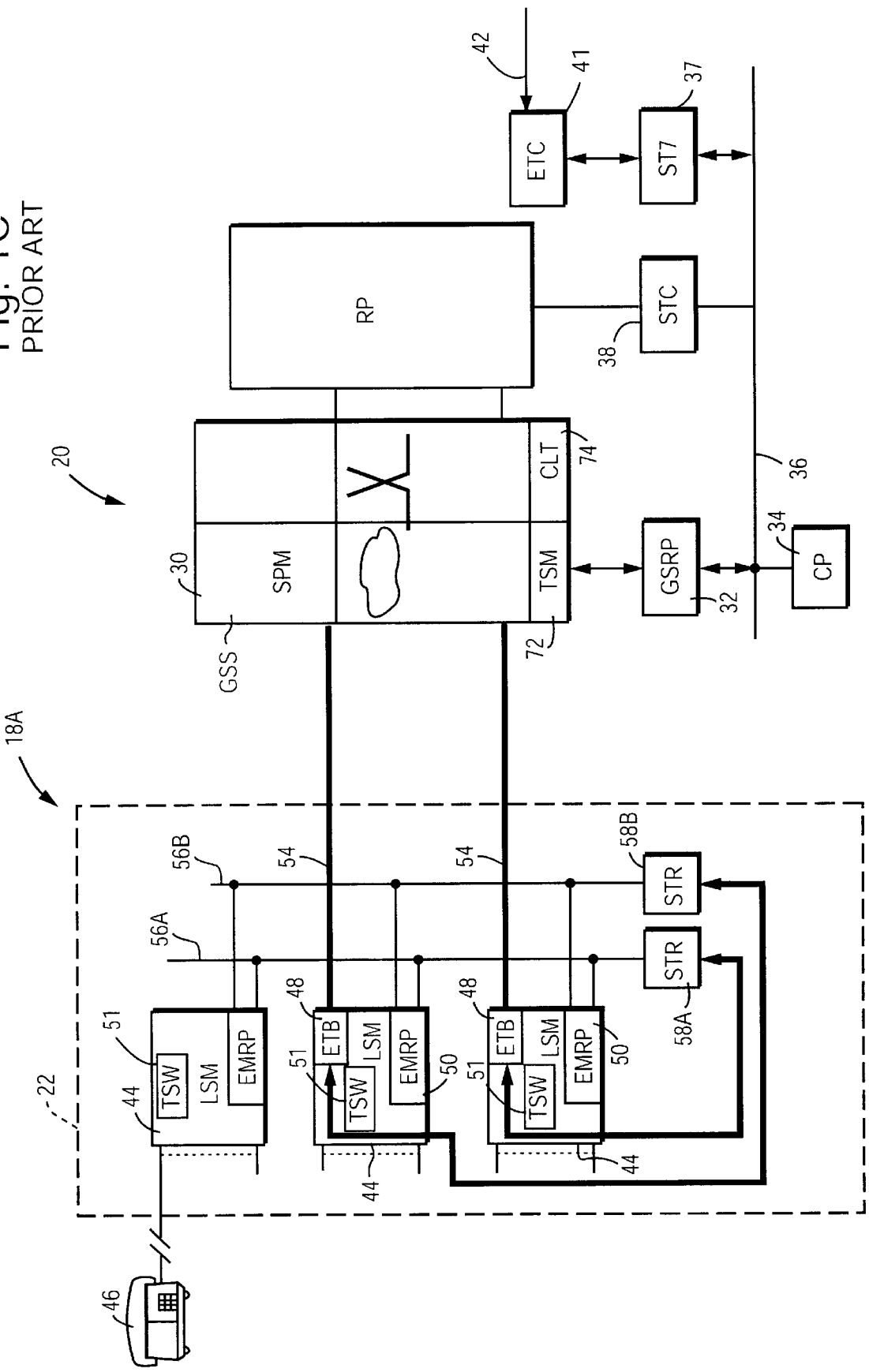
FIG. 1C is a schematic view of a telephone switching system including a remote subscriber stage, and having a standard interface.

Whereas the telephone switching systems of FIG. 1A and FIG. 1B utilized a non-standard interface, the telephone system of FIG. 1C utilizes a standard interface, such as a V5 interface. The telephone system of FIG. 1C differs primarily from the telephone switching systems of FIG. 1A in that signaling channels are routed through group switch 30 to one or more regional processors RP, with signaling channel information being forwarded via STC 38 and over regional processor bus 36 to central processor 34.

1.1 Central Processor of Conventional Exchanges

Figure 2:
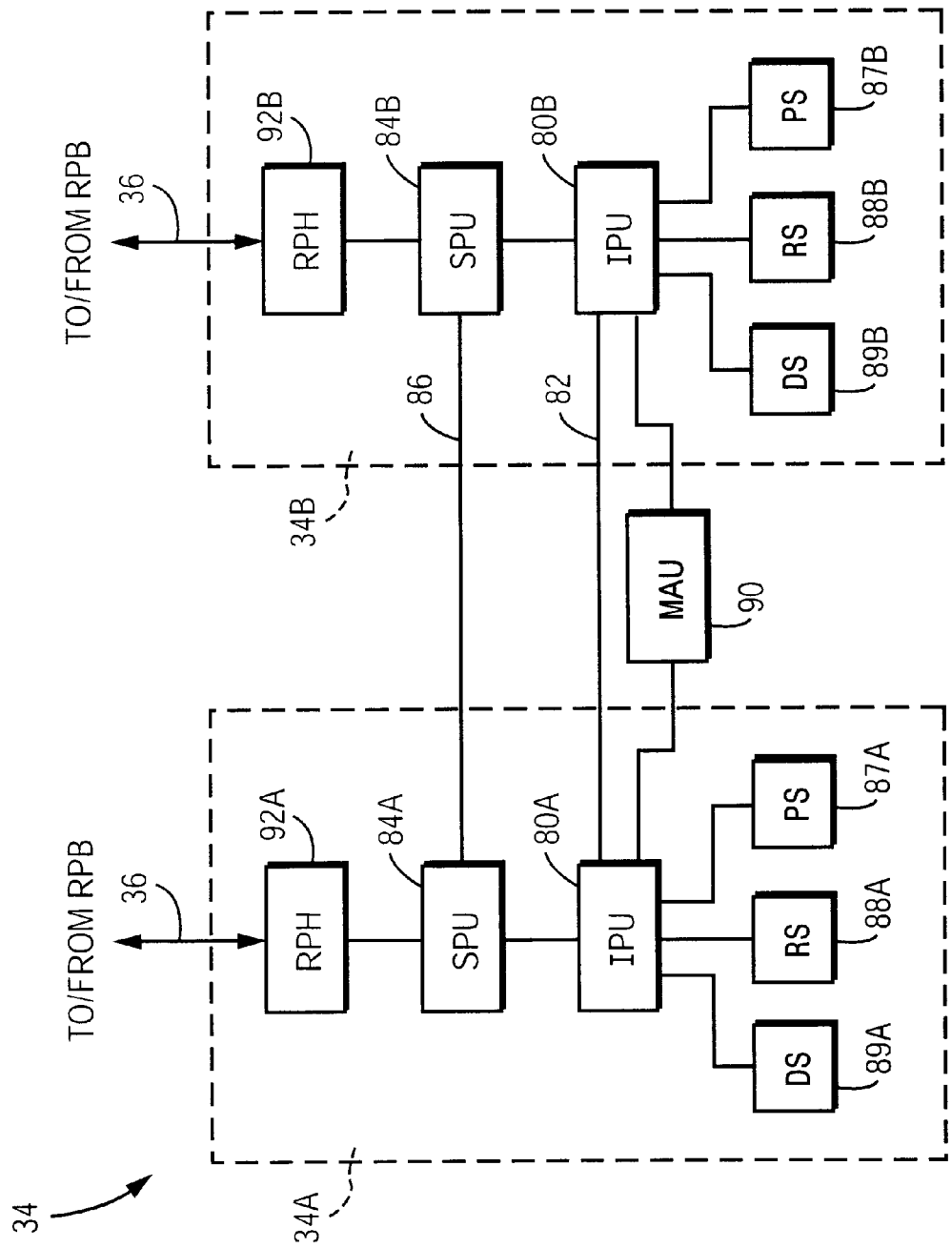
FIG. 2 is a schematic view of a central processor for a telephone switching system according to an embodiment of the invention.

An embodiment of central processor (CP) 34 is shown in FIG. 2. In actuality, central processor (CP) 34 comprises two central processors. particular central processor 34A and central processor 34B, which are collectively referenced as central processor 34. Each central processor includes an instruction processor unit (IPU) 80, with instruction processor units 80A and 80B being connected by an IPU updating and matching bus 82. Each central processor also includes a signal processor unit (SPU) 84, with signal processor units 84A and 84B being connected by a SPU updating and matching bus 86. The signal processing units 84 administer work in the CP 34, and prepare work to be done by the instruction processor units 80, thereby enabling the instruction processor units (IPUs) to execute programs continuously. The instruction processor units (IPUs) execute programs, with the signal processor units telling the IPUs the address at which the programs should be executed.

Each instruction processor (IPU) 80 has access to three storage units, particularly program store (PS) 87, reference store (RS) 88, and data store (DS) 89. As indicated above, instruction processor (IPU) 80 executes jobs, each job corresponding to a block of instructions stored in program store (PS) 87. Signal processor (SPU) 84 serves as a scheduler of jobs for instruction processor (IPU) 80. In connection with such scheduling, for each job signal processor (SPU) 84 receives a program "signal", e.g., from the outside world or from instruction processor (IPU) 80. Generally speaking, a program signal is an instruction telling where to execute in a specific part of a block of instructions, the program signal including data to be utilized in execution of the block. Reference store (RS) 88 contains information describing the program signals, the blocks, and the variables used in the system.

A maintenance unit (MAU) 90 is connected to both instruction processors (IPUs) 80. Maintenance unit (MAU) 90 has several functions, including initiating tests in case of fault and deciding which side, e.g., central processor 34A or central processor 34B, is to be designated as an executive.

Each central processor 34 also includes a regional processor handler 92. Regional processor handler 92 handles the program signaling to and from various regional processors, including the regional processor bus converters 60 and group switch regional processor(s) 32. Regional processor handler 94 is connected to its associated signaling processor (SPU 84) and to regional processor bus (RPB) 36.

Further architecture of a particular central processor 34, known as the APZ, and an exemplary manner of scheduling jobs therein is disclosed in U.S. patent application Ser. No. 08/574,977, filed Dec. 19, 1995, entitled "JOB SCHEDULING FOR INSTRUCTION PROCESSOR", which is incorporated herein by reference.

As indicated above, instruction processor (IPU) 80 executes jobs, each job corresponding to a block of instructions stored in program store (PS) 87. The instructions executed by instruction processor (IPU) 80 and obtained from program store (PS) 87 are coded in the instruction set of the central processor 34. In the illustrated embodiment, the instruction set is for the APZ.

1.2 Switch Cores of Conventional Exchanges

Figure 3:
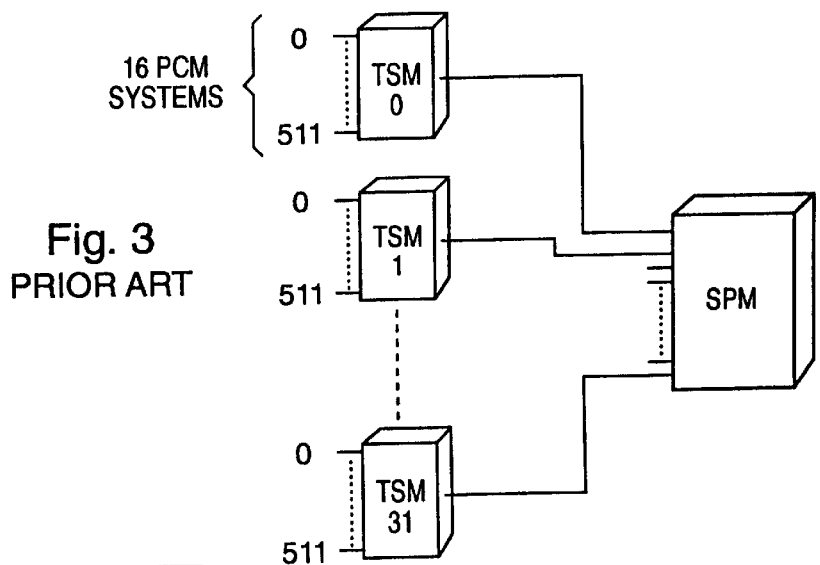
FIG. 3 is a diagrammatic view depicting the relationship of basic components comprising a core of a group switching subsystem (GSS).

FIG. 3 shows, in simplified form, the relationship of basic components comprising the core of group switching subsystem (GSS) 30. In particular, FIG. 3 shows that a plurality of time switch modules (TSMs), e.g. TSM 0 through TSM 31, are connected to a space switch module (SPM). Each time switch module (TSM) has plural inputs/outputs, e.g., 512 PCM lines, connected thereto. When a connection is set up, the path of the connection through group switching subsystem (GSS) 30 is through a time switch module (TSM), via a space switch module (SPM), to the same or another time switch module (TSM). Thus, group switching subsystem (GSS) 30 is said to have a T-S-T (Time-Space-Time) structure. As used herein, a group switch is any switching device which has a T-S-T structure.

Figure 3A:
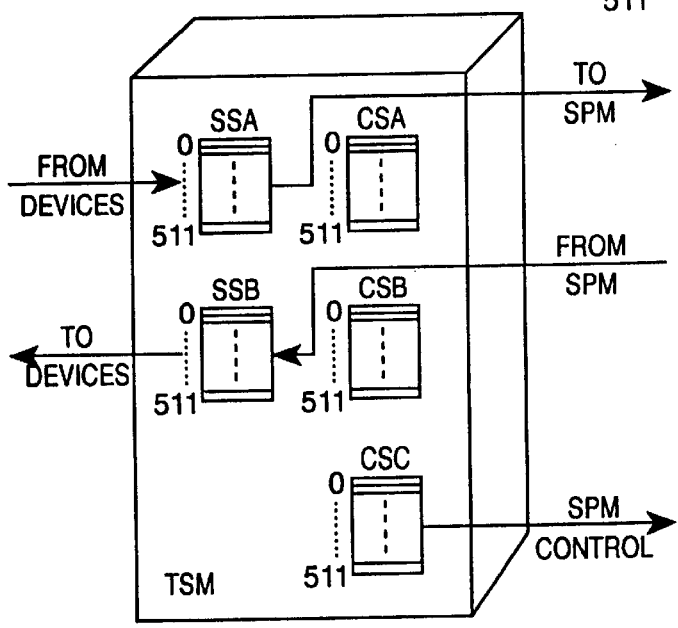
FIG. 3A is a diagrammatic view of a time switch module (TSM) included in the core of the group switching subsystem (GSS) of FIG. 3.

As shown in FIG. 3A, each time switch module (TSM) has memories, known as stores. Some of the stores are known as speech stores and provide temporary storage of traffic (e.g., speech) samples. Others of the stores are control stores which control the order of read-out from a corresponding speech store. Since a time switch module (TSM) handles traffic (e.g., samples) in both directions, a speech store and a control store are needed for samples entering the time switch module (TSM) and another for samples leaving the time switch module (TSM). Thus, as shown in FIG. 3A, time switch module (TSM) is provided with speech store SSA and control store CSA for samples entering the time switch module (TSM), and with speech store SSB and control store CSB for samples leaving the time switch module (TSM). In addition, time switch module (TSM) has a control store for the space switch module (SPM), labeled as CSC.

Figure 3B:
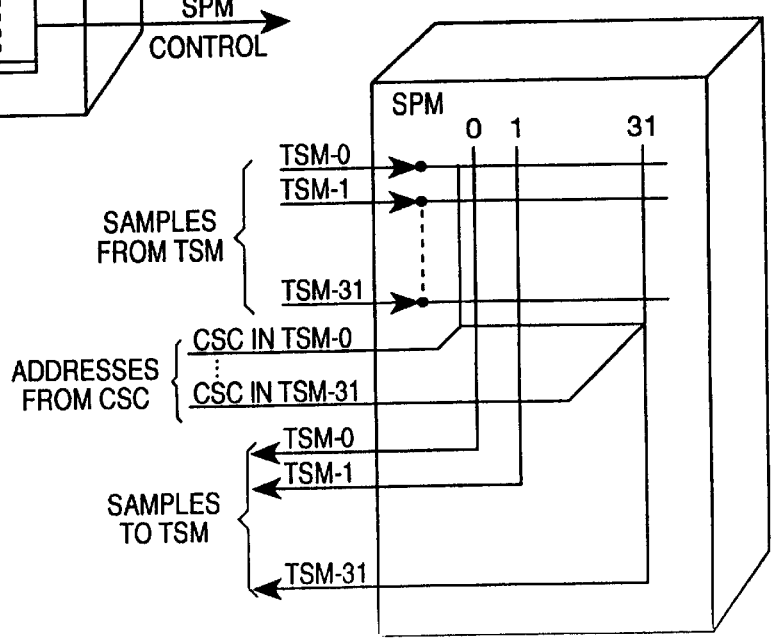
FIG. 3B is a diagrammatic view of a space switch module (SPM) included in the core of the group switching subsystem (GSS) of FIG. 3.

FIG. 3B shows that space switch module (SPM) can be illustrated as an ordinary matrix with cross points. The cross points represent logic gates that open and close. The space switch module (SPM) control store CSC of a time switch module (TSM) controls a row of "cross points" (e.g., the CSC in TSM 0 controls all "cross points" leading to TSM 0).

When a connection is to be set up in group switching subsystem (GSS) 30, the software of central processor 34 (see e.g., FIG. 1A) selects the path through the switch core. Path selection refers to the moment when a sample is to be transferred, and is called selection of an internal time slot. After the software of central processor 34 has selected a path, the regional software of group switch regional processors (GSRP) 32 writes information to implement the path in the control stores of the TSMs involved with the specific path.

Figure 4:
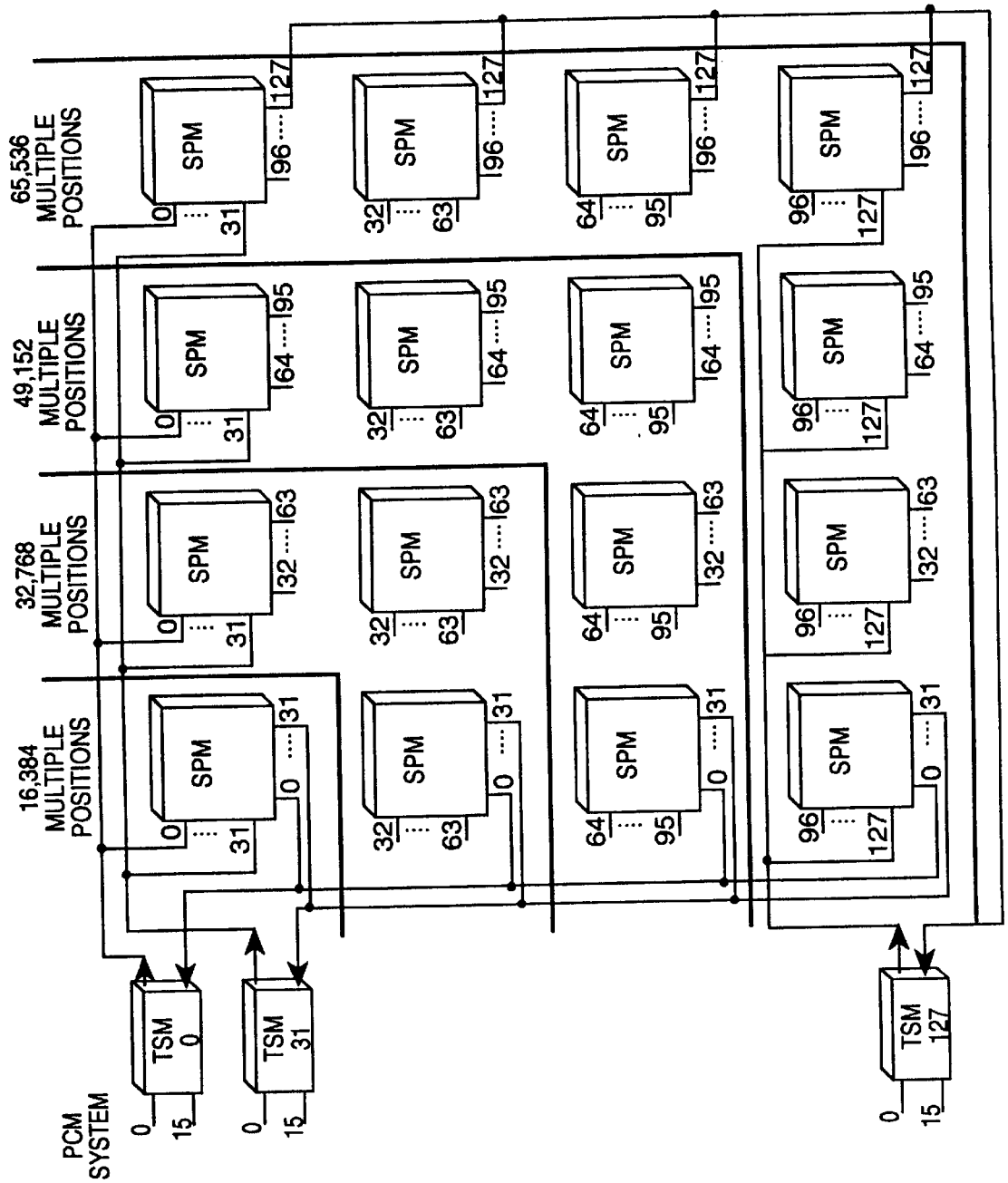
FIG. 4 is a diagrammatic view of a group switching subsystem (GSS) having several interconnected space switches.

FIG. 3 shows thirty two time switch modules (TSM) connected to each space switch module (SPM). FIG. 4 shows that a larger switch core can be built by interconnecting several space switch modules (SPMs) to form a large matrix with greater switching capacity.

2.0 Structures of Inventive Exchanges

Figure 5A:
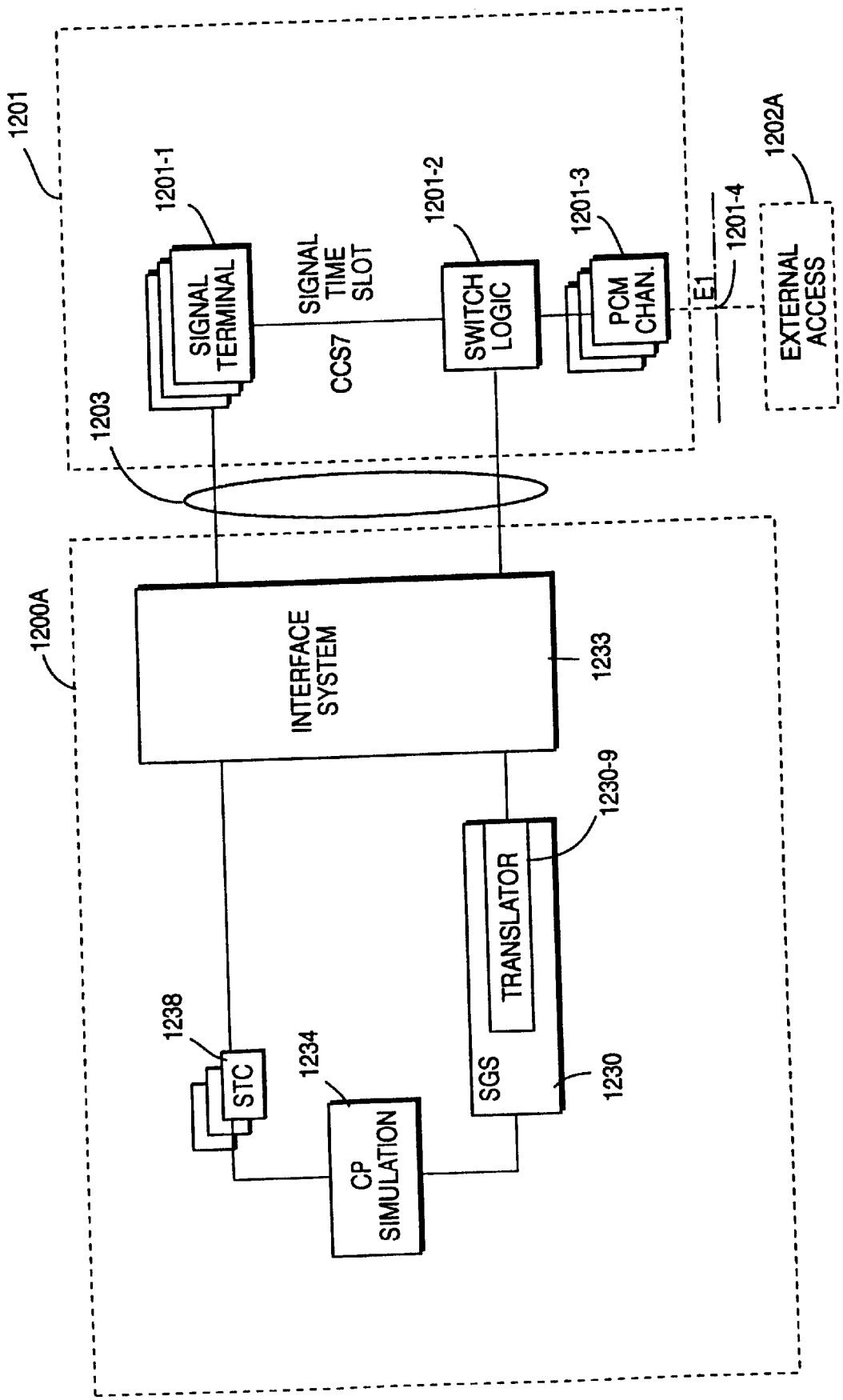
FIG. 5A is a schematic view of a telecommunications exchange according to a first embodiment of the invention.

A first embodiment of a telecommunications exchange according to the invention is shown in FIG. 5A. The telecommunications exchange of FIG. 5A includes an exchange main processor 1200A; a replacement switching device 1201; and, external access modules 1202A.

Figure 5B:
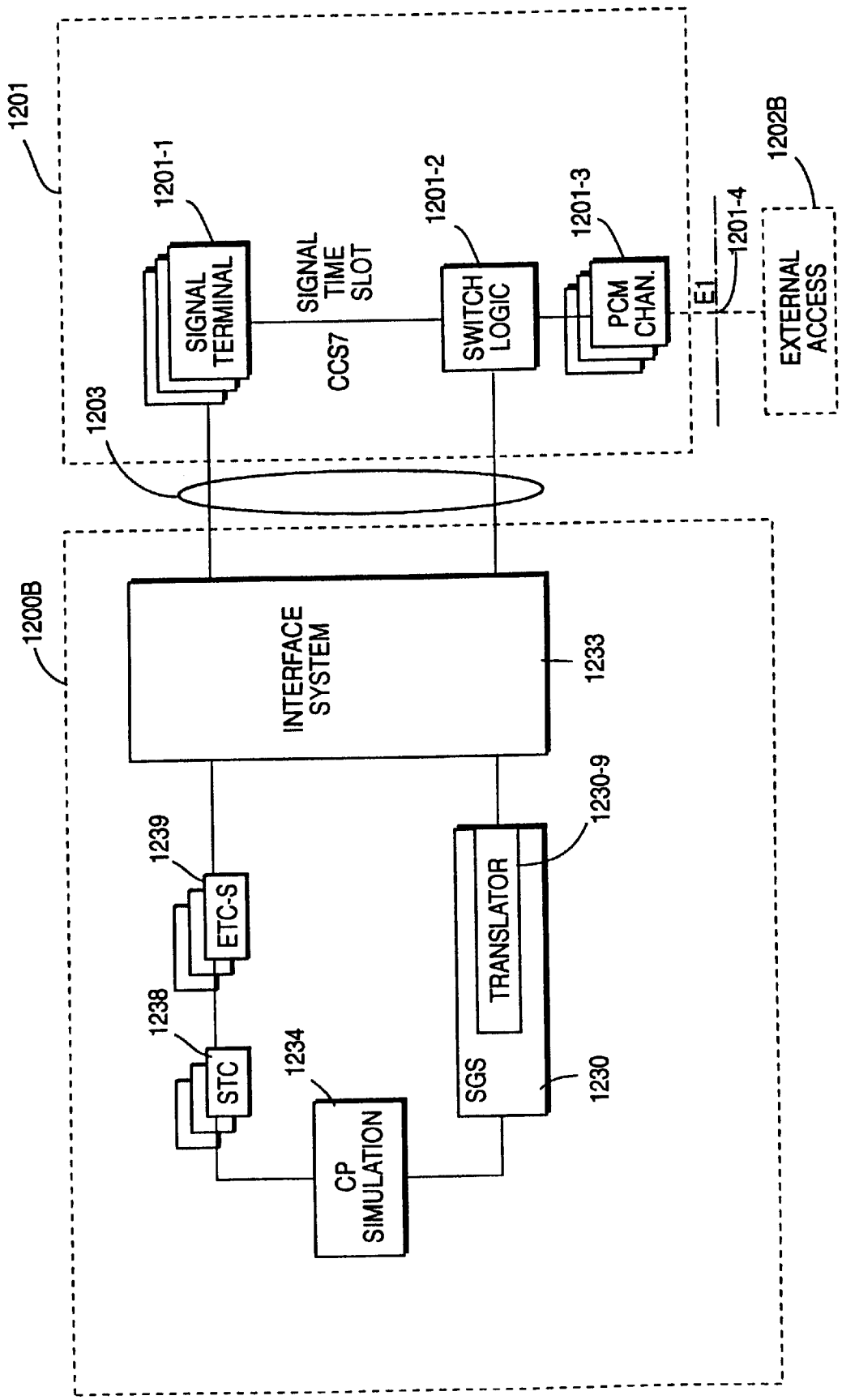
FIG. 5B is a schematic view of a telecommunications exchange according to a first embodiment of the invention.
Figure 5C:
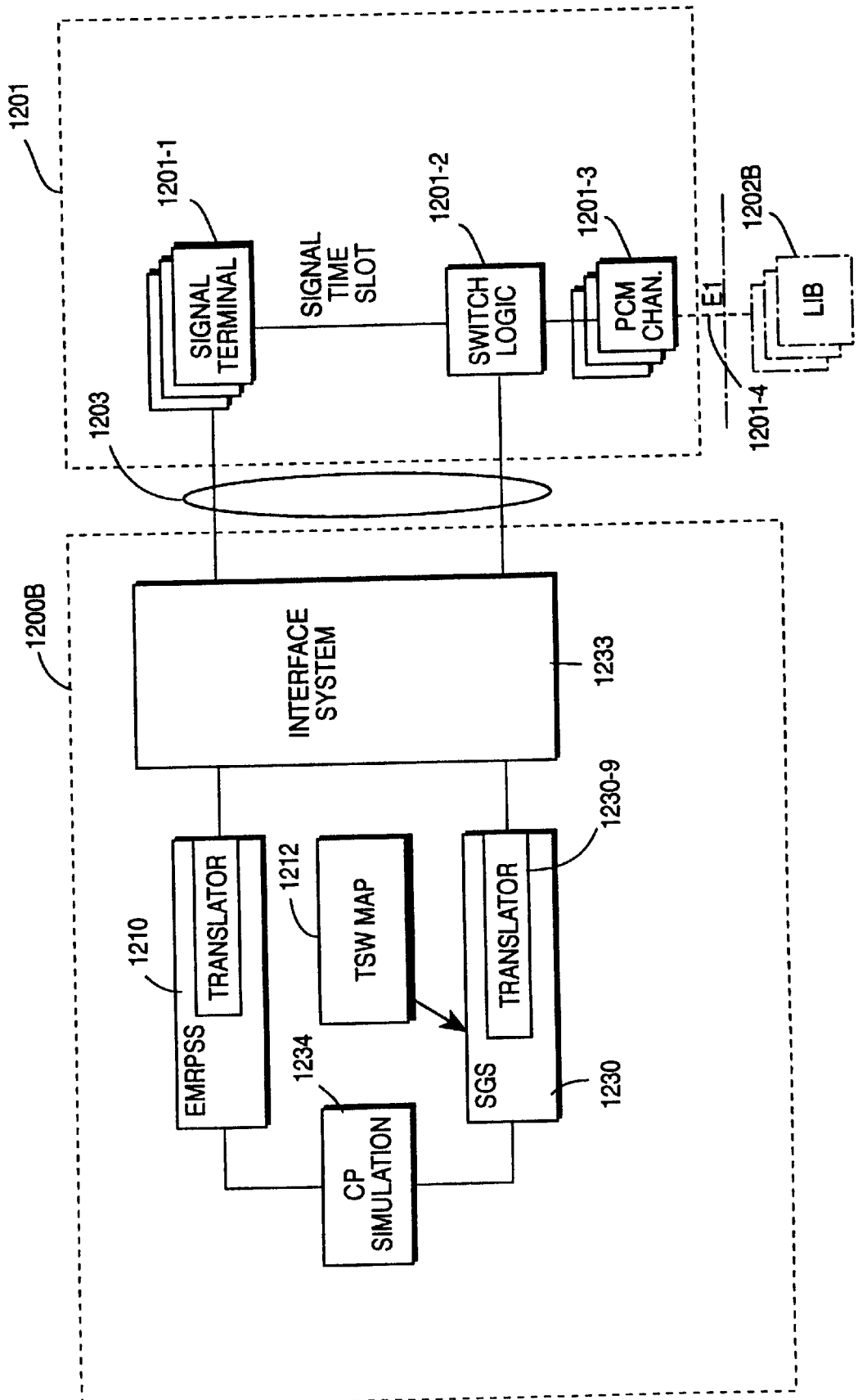
FIG. 5C is a schematic view of a telecommunications exchange according to a first embodiment of the invention.

Second and third embodiments of telecommunications exchanges of the invention are shown in FIG. 5B and FIG. 5C, respectively. The second and third embodiments similarly have replacement switching device 1201, but (as explained hereinafter) having differing types of external access modules 1202B, 1202C, respectively. As explained hereinafter, the exchange main processors of the invention perform simulations. Thus, exchange main processor 1200 is also known as the exchange simulation processor. Since the simulation steps performed in the embodiments of FIG. 5A, FIG. 5B, and FIG. 5C may differ despite potentially the same hardware, for these embodiments the exchange main processors are referenced as 1200A, 1200B, and 1200C, respectively. Hereinafter, when general reference is intended to the exchange main processors of any of the embodiments, the reference numeral 1200 is employed. Similarly, when general reference is made to any of the external access module types, the reference numeral 1202 is utilized.

2.1 Switching Device

Switching device 1201, which can be common to all embodiments, can be any arrangement of appropriate switch hardware components utilizable for connection to telecommunications access modules, e.g., PCM links.

The example switching device 1201 shown in the illustrated embodiments is not a group switch (e.g., not a T-S-T type of switch), but instead is a packet handling switch which distributes packets (with traffic payload) on a time slot basis based on address information provided in a packet header. As shown in each of the embodiments of FIG. 5A, FIG. 5B, and FIG. 5C, in terms of hardware the example switching device 1201 includes one or more signaling terminals 1201-1, switch logic 1201-2, and PCM interface 1201-3. At its ports 1201-4 the switching device 1201 is connected by PCM channels or links to the external access units 1200. A signaling system, preferably a time-slotted Signaling System No. 7 system, is implemented between signaling terminals 1201-1 and switch logic 1201-2.

Although not shown as such, switching device 1201 has a processor system which performs various functions of, e.g., signaling terminals 1201-1 and switch logic 1201-2. In the illustrated embodiment, the processor system of switching device 1201 executes Erlang language programs. Signaling terminals 1201-1 are viewed in terms of the structure of a group switch-based exchange as performing the functionality of signaling terminal 37 and regional processor functions. In this regard, in a protocol sense the signaling terminals 1201-1 terminate the connection signaling (e.g., CCS No. 7) and are programmed to translate the connection signaling into CP/RP program signals for transmission through interface 1233 and to the simulated signaling subsystems provided by exchange main processor 1200.

The illustrations of FIG. 5A, FIG. 5B, and FIG. 5C show switching device 1201 as being connected to subscriber lines. Although not so illustrated, it should be understood that switching device 1201 can also be connected to other exchanges through trunk lines, and that such trunk lines are connected to signaling terminals 1201-1 in the manner that ETC 41 is so connected in FIG. 1A, for example.

Figure 6:
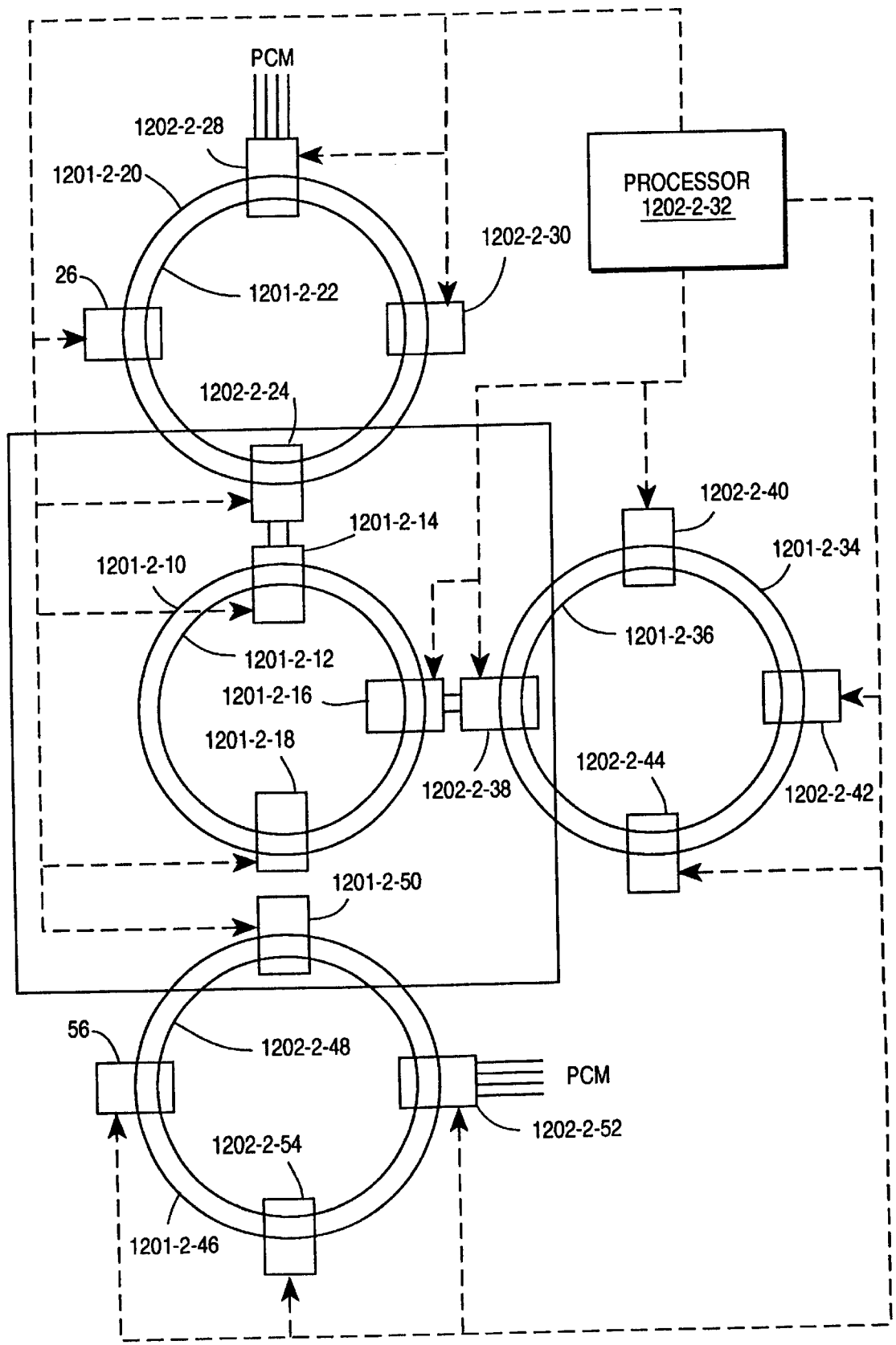
FIG. 6 is a schematic view of a switch logic hardware included in a replacement switching device of the telecommunications exchanges of the present invention.

Switch logic 1201-2 of switching device 1201 is shown in FIG. 6 as comprising plural pairs of high speed ringed links. For example, ringed links 1201-2-10 and 1201-2-12 form a first pair; ringed links 1201-2-20 and 1201-2-22 form a second pair; ringed links 1201-2-34 and 1201-2-36 form a third pair; and 1201-2-46 and 1201-2-48 form a fourth pair. Each pair of ringed links serves nodes which add or remove traffic from the ringed links. The nodes are also referred to as switchboards, since they can be fabricated on integrated circuit boards. Some of the switchboards, such as switchboards 1201-2-14, 1201-2-16 and 1201-2-18, serve e.g., to connect a ringed pair to another ringed pair. Some of the switchboards, such as switchboards 1201-2-28 and 1201-2-52, for example, are connected to PCM lines which connected, e.g., to subscribers. Switch logic 1201-2 is controlled by processor 1201-2-32.

Figure 6A:
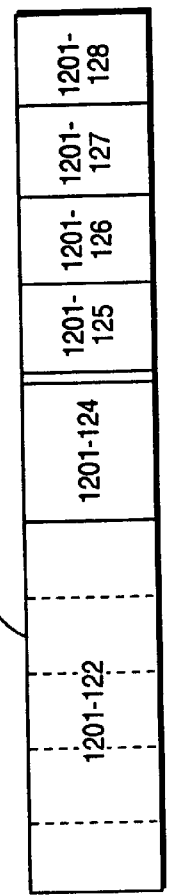
FIG. 6A is a diagrammatic view of a packet including a packet header utilized in a replacement switching device of the telecommunications exchanges of the present invention.

FIG. 6A shows a format of a message or packet 1201-114 which is routed through switching device 1201. The packet 1201-114 of FIG. 6A has payload 1201-122 and a control field 1201-124. Packet 1201-114 also has a header comprised by various address fields, including local address field 1201-126, intermediate address field 1201-127, and global address field 1201-128. Global address field 1201-128 points to the loop in which a switchboard is located; intermediate address field 1201-127 points to a particular switchboard; and local address field 1201-126 points to a particular PCM link. A descriptor pointer 1201-125 is also provided in the header of packet 1201-114.

Figure 6B:
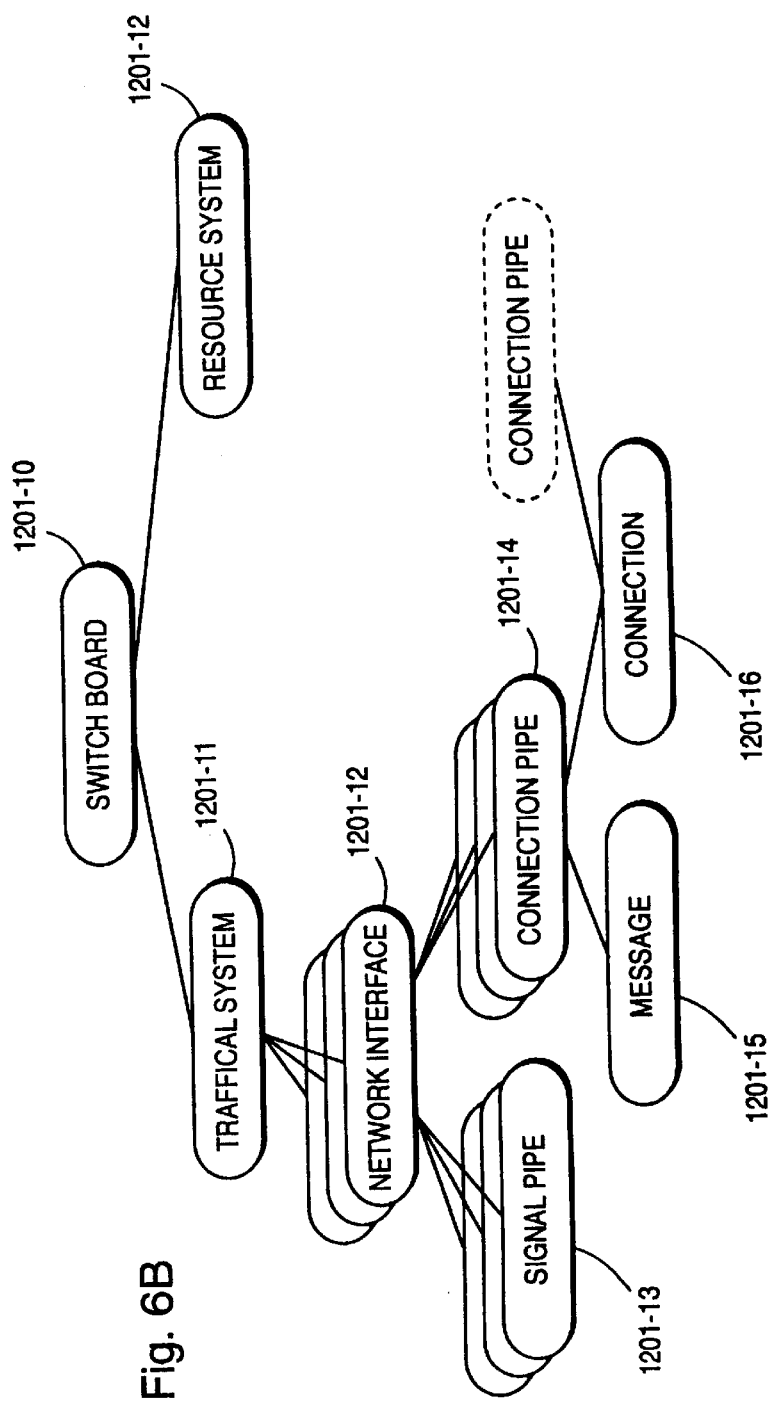
FIG. 6B is a diagrammatic view of functional objects included in a replacement switching device of the telecommunications exchanges of the present invention.

Switching device 1201 is conceptualized as having the functional objects shown in FIG. 6B. These functional objects are implemented in a combination of hardware and software. A tree configuration exists among various ones of the functional objects of switching device 1201. The functional objects of switching device 1201 include switchboard object 1201-10, which is a parent object to traffic system object 1201-11 and to resource system object 1201-12. Traffic system object 1201-11 is a parent to network interface object 1201-12, which in turn serves as a parent object to (connection) signal pipe object 1201-13 and connection pipe object 1201-14. Connection pipe object 1201-14 is a parent to message object 1201-15 and to connection object 1201-16.

As shown in FIG. 6B, for switching device 1201 a network interface can be configured with signal pipes and connection pipes. For each pipe a bandwidth is defined, normally 64 kbits/second, i.e., one time slot. As used herein, a signal pipe represents a signal channel (normally one signal pipe is created under each network interface). A connection pipe represents a speech channel. Normally thirty connection pipes are created under each network interface (e.g., time slot 1–15, 17–31). A connection represents a simplex connection between two connection pipes. For a duplex connection, two connections have to be set up, one for each direction. One connection pipe can have several connections that terminate in different connection pipes. The incoming samples will then be sent simultaneously to the terminating connection pipes. A message represents an ongoing tone or speech message towards a connection pipe.

One example of hardware suitable for use as switch hardware components 1201 is described in U.S. patent application Ser. No. 08/993,240, filed Dec. 18, 1997, and entitled "DEVICE AND METHOD RELATED TO TELECOMMUNICATION NETWORKS", which is incorporated herein by reference and which is based on International Patent Application PCT/SE97/02085.

2.2 Exchange Main Processor

Figure 7:
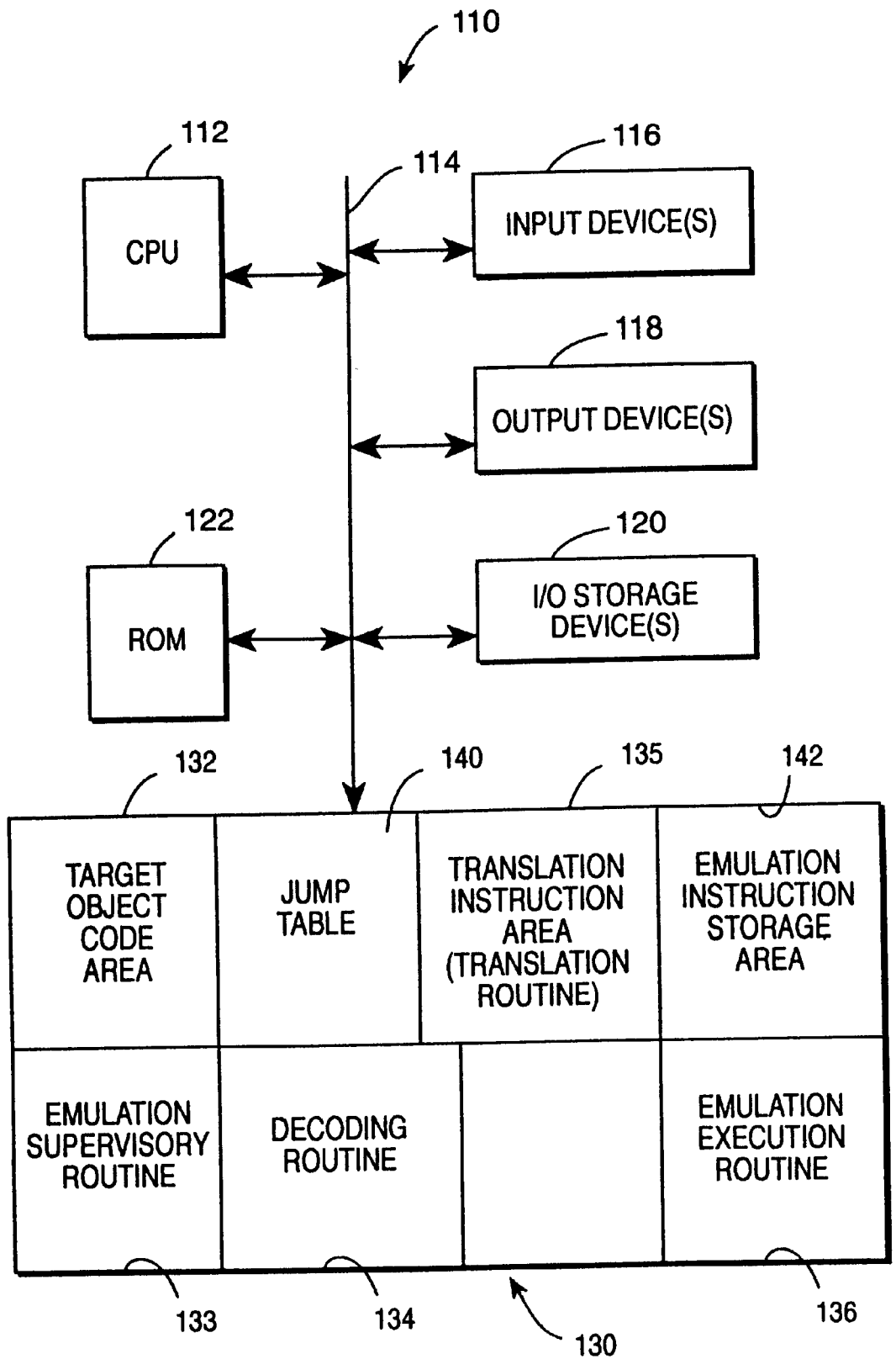
FIG. 7 is a schematic view of a computer system utilizable for an exchange main processor for the telecommunications exchanges of the present invention.

Exchange main processor 1200A is implemented by an industry standard processor of a conventional computer system. FIG. 7 shows such a conventional computer system 110 according to an embodiment of the invention. Conventional computer system 110 includes a processing unit, e.g., CPU 112, which corresponds to exchange main processors 1200A, 1200B, and 1200C of FIG. 5A, FIG. 5B, and FIG. 5C, respectively. CPU 112 communicates with other constituent units of conventional computer system 110 over bus 114. The other constituent units of conventional computer system 110 include input device(s) (e.g, keyboards and pointers [e.g., mouse]) 116; output device(s) (e.g., displays, printers) 118; input/output storage device(s) 120 (e.g., disk drives); read only memory (ROM) 122; and, random access memory (RAM) 130. The person skilled in the art understands that various ones of these constituent units are connected to bus 114 through appropriate interfaces. One example of exchange main processor 1200A is an Intel Pentium processor with 256 Mbyte of RAM. It should be understood, however, that other high powered processors can be used, including (advantageously) industry standard processors.

In the embodiments of the present invention, the exchange main processors 1200 execute sets of instructions or programs which serve to emulate or simulate processors and subsystems of a traditional exchange which employs a group switch. The sets of instructions or programs or programs executed by exchange main processors 1200 of the differing embodiments are in a first language, such as C, for example.

2.3 Access Units

The telecommunications exchange of FIG. 5A is employed when the access unit 1202A connected to switching device 1201 is an external access having a standard interface, such as the industry standard V5 interface, for example. The telecommunications exchange of FIG. 5B, on the other hand, is employed when the access unit 1202B is an external access having a non-standard interface. The telecommunications exchange of FIG. 5C, is employed when the access unit 1202C is a line interface board (LIB).

2.4 Interfaces

Figure 8:
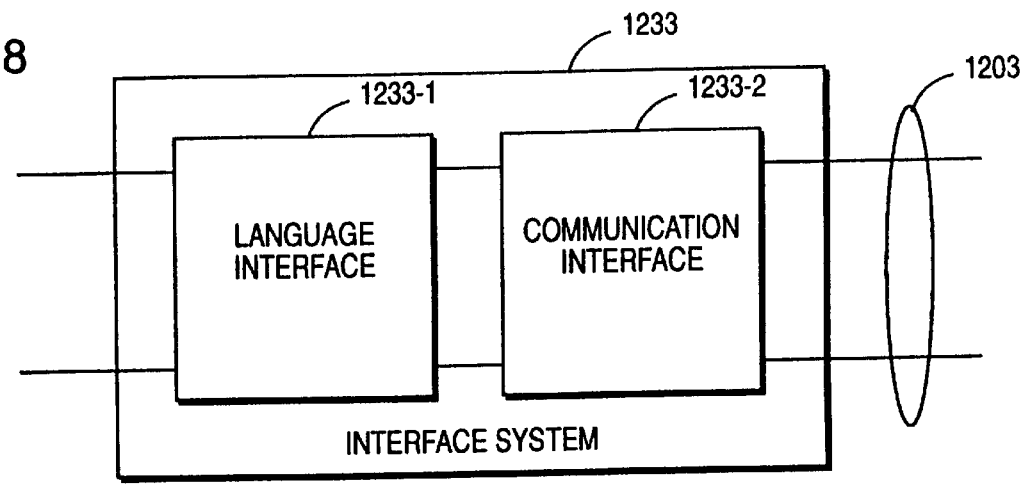
FIG. 8 is a schematic view of an interface system according to embodiments of the invention.

As shown in FIG. 8, interface system 1233 includes both a language interface 1233-1 and a communication interface 1233-2. As mentioned above, in the illustrated embodiment exchange main processor 1200 executes the simulation systems in the C language. On the other hand, in the illustrated embodiment the software of switching device 1201 is in the Erlang language. Therefore, a translation between C language and Erlang language is required and is performed by C/Erlang interface 1233-1. In some situations, the C/Erlang interface 1233-1 is included in simulation subsystems, as explained below.

Communication interface 1233-2 is referred to as Erlang application programming interface (API). C/Erlang interface 1233-1 translates commands, issued for switch hardware system 1201 from simulation elements, into Erlang API calls. Erlang API 1233-2 is a program module which runs on exchange main processor 1200 and is executed by an Erlang engine. Erlang API communicates with switching device 1201 using TCP/IP on an Ethernet link illustrated as link 1203.

As mentioned above, the hardware for the exchange main processors 1200 of the various embodiments can be essentially identical it desired. In all embodiments the exchange main processors 1200 execute programs which serve as a simulation of portions of a conventional exchange with employs a group switch. The basic simulation is described below, with the primary differences of the embodiments noted at appropriate junctures.

2.5 Simulation Processors and Subsystems

All exchange main processors 1200 perform a simulation which includes a simulated central processor 1234; a simulated group switch subsystem (SGS) 1230, simulated connection signaling subsystems, and an interface system 1233.

2.5.1 Simulated Central Processor

Figure 9:
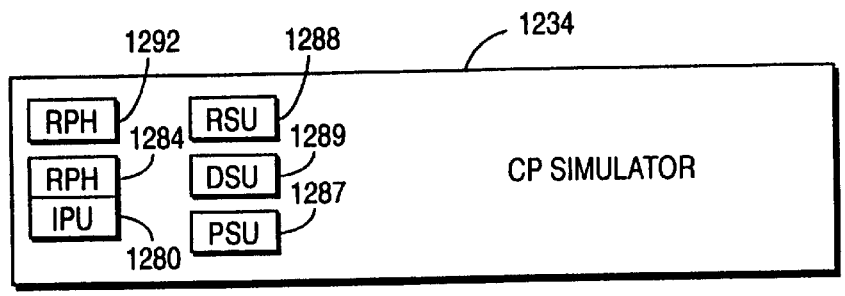
FIG. 9 is a schematic view of central processor simulator according to an embodiment of the invention.

As shown in FIG. 9, simulated central processor 1234 is comprised of a simulated instruction processor unit (IPU) 1280; a simulated signal processor unit (SPU) 1284; a simulated program store (PSU) 1287; a simulated reference store unit (RSU) 1288; a simulated data store unit (DSU) 1289; and, a simulated regional bus handler 1292. In the illustrated embodiment, simulated central processor 1234 simulates an APZ212 20 processor including the complete instruction set and register of instruction processor unit (IPU) 80. The signal processor unit (SPU) 84 and regional processor handler (RPH) 92 are simulated at the interface level. The simulated central processor 1234 is designed for high speed execution of target code, i.e., code of the simulated system.

Simulated central processor 1234 coordinates access to the telecommunications exchange and performs basic call control functions. Simulated central processor 1234 thinks that it is controlling a group switch represented by simulated group switch subsystem (SGS) 1230. In connection with the switch control, simulated central processor 1234 sends TSM orders to simulated group switch subsystem (SGS) 1230, ultimately to TSMR simulator 1230-5, for making the connection through the group switch. However, as described below, the simulated central processor 1234 actually controls the replacement switching device 1201 and makes connections therethrough.

2.5.2 Simulated Connection Signaling Subsystems

The connection signaling subsystems of the various embodiments differ in some respects as briefly described below.

In the FIG. 5A embodiment of the telecommunications exchange of the present invention, which is suited for standard interface (e.g., V5) external access, the signaling subsystems simulated by exchange main processor 1200A include STC simulation module 1238. STC simulation module 1238 of the embodiment of FIG. 5A simulates a part of the functionality of STC 38 (see FIG. 1C). It will be recalled that signaling terminal 1201-1 provides the functionality of a regional processor (analogous to regional processor RP in FIG. 1C).

The STC simulation module 1238 includes functional simulation of the STCE (STC Executive) and regional program CLCR (Control signaling Link Central). The STC Executive provides mechanisms for connection signal conversion between RPB format and EMRPB format and administration of EMRP(D) loading with the aid of I/O transfer. It also provides job administration and program execution support for CLCR and functions necessary for RP maintenance. Details of a comparable STC simulation are ascertained from U.S. patent application Ser. No. 08/887,653, filed Jul. 3, 1997 and entitled "SIMULATION OF COMPUTER-BASED TELECOMMUNICATIONS SYSTEM", which is incorporated herein by reference.

In the FIG. 5B embodiment of the telecommunications exchange of the present invention, which is suited for non-standard interface external access, the signaling subsystems simulated by exchange main processor 1200B include STC simulation module 1238 and ETC-S 1239. STC simulation module 1238 of the embodiment of FIG. 5A simulates a part of the functionality of STC 38 (see FIG. 1A).

The simulation ETC-S 1239 in FIG. 5B can logically be regarded as a simulation of the connection signaling part of an exchange terminal circuit, such as ETC 40 of FIG. 1A. In exchange main processor 1200A, STC simulation module 1238 and the simulation ETC-S 1239 communicate directly with one another without any implementation of an ETC and an ETB. The simulation ETC-S 1239 implements the simulated STR interface to an STC. The interface to an EMRP in the STR element is replaced by commands (via the Erlang API 1233-2) to switch hardware system 1201. These commands provide connection signal information through the signal time-slot on the connected PCM channel of switch hardware system 1201. The CCS7 protocol is implemented for this purpose on switch hardware system 1201.

The connection signaling subsystems simulated by exchange main processor 1200C of the embodiment of FIG. 5C include an EMRP signaling simulator (EMRPSS) 1210. Thus, the EMRP signaling simulator (EMRPSS) 1210 has the functionality of extension module regional processor (EMRP) 50 and a time switch (TSW) 51 in a subscriber switch. In other words, the EMRP signaling simulator (EMRPSS) 1210 corresponds to a subscriber stage except it does not have the line interface board (LIB). The connection signaling input/output is translated from AXE program signals to commands for switching device 1201 and vise versa. As there is no TSW between the line interface board (LIB) and switching device 1201, information from simulated central processor 1234 about line-to-time slot mapping are transferred to the TSW map element 1212 from where it can be accessed by simulated group switch subsystem (SGS) 1230.

In the FIG. 5C embodiment, TSW map element 1212 contains information about the current line-to-time slot mapping of time switches (TSWs) simulated in EMRP signaling simulator (EMRPSS) 1210. The simulated group switch subsystem (SGS) 1230 needs this mapping information to map TSM orders from simulated central processor 1234 for the embodiment of FIG. 5C.

2.5.2 Simulated Group Switch Subsystem

Figure 11:
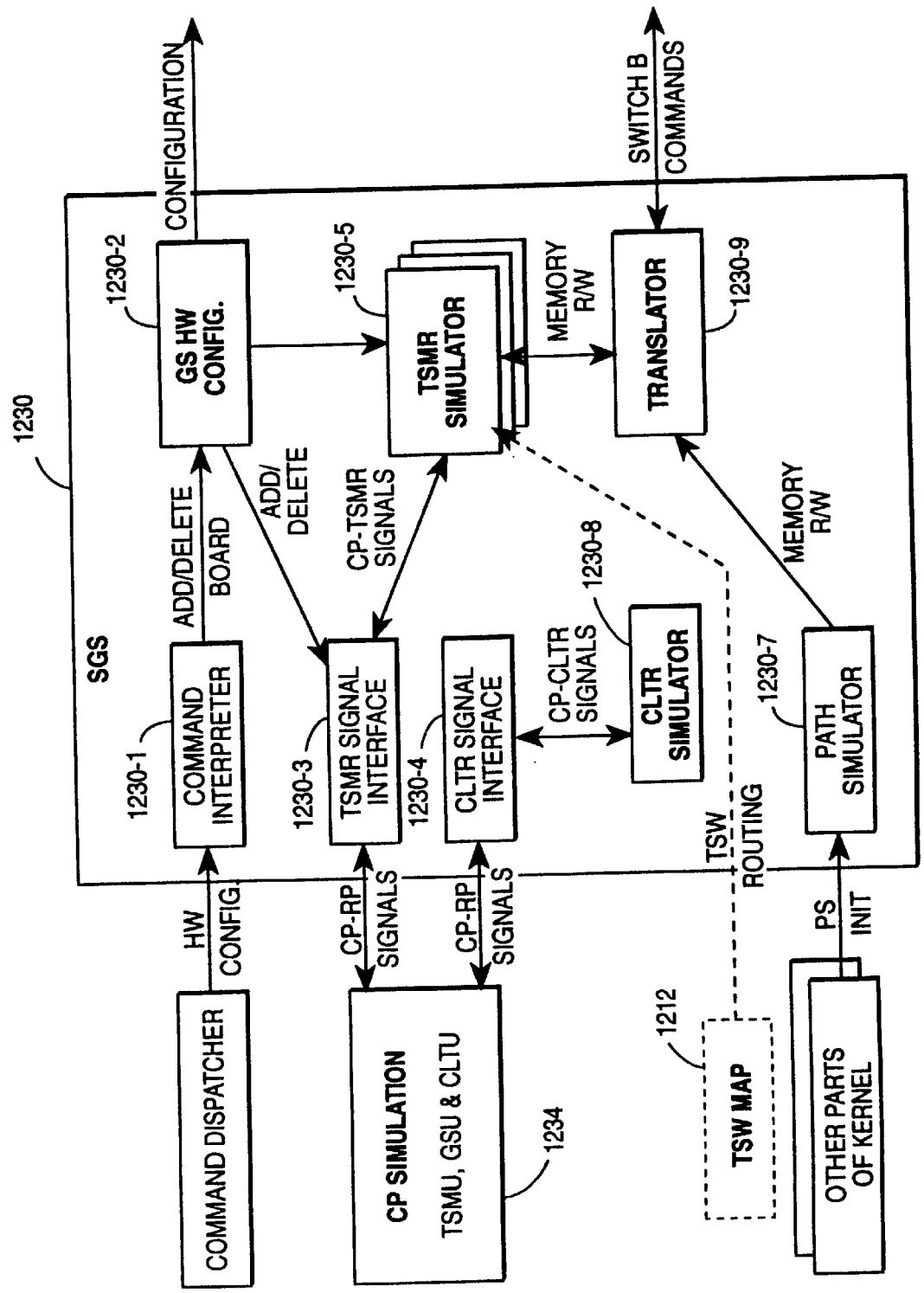
FIG. 11 is schematic view of a group switch simulation module according to embodiments of the invention.

FIG. 11 shows an embodiment of simulated group switch subsystem (SGS) 1230 suitable for use in conjunction with the exchange main processors 1200 of the various embodiments described herein. In particular, simulated group switch subsystem (SGS) 1230 includes command interpreter 1230-1; hardware configuration module 1230-2; TSMR signal interface 1230-3; CLTR signal interface 1230-4; TSMR simulator 1230-5; path simulator 1230-7; CLTR simulator 1230-8; and, translator 1230-9.

Figure 10:
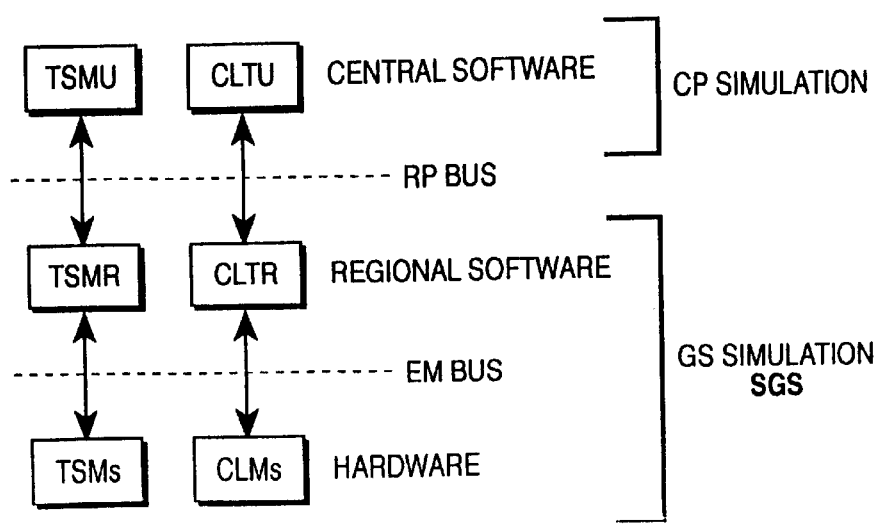
FIG. 10 is a diagrammatic view showing distribution of software corresponding to various simulation modules according to embodiments of the invention.

As shown in FIG. 10, in addition to other blocks of simulated group switch subsystem (SGS) 1230, simulated central processor 1234 simulates CP 34 as well and the central software of TSM 72 and CLT 74 (see e.g., FIG. 1A) [shown as TSMU and CLTU, respectively in FIG. 10]. Such being the case, there is no need to simulate the TSMU and CLTU functions in simulated group switch subsystem (SGS) 1230. FIG. 10 also shows that the TSMU functions are time switch functions performed by software of simulated central processor 1234; the TSMR functions are time switch functions performed by software of simulated regional processors. The CLTU functions are clock functions performed by software of simulated central processor 1234; the CLTR functions are clock functions performed by software of simulated regional processors. FIG. 10 shows that the TSMU and CLTU functions are executed in simulated central processor 1234, and that the simulated group switch subsystem (SGS) 1230 simulates the regional software (for the TSMR and CLTR) and the hardware (for TSMs and CLMs).

Command interpreter 1230-1 includes routines for handling hardware configuration commands concerning either switching device 1201 or the simulated group switch hardware. Command interpreter 1230-1 can be a commercially available and/or standardized command handler, such as that known as TCL.

Hardware configuration module 1230-2 is a function for managing the simulated group switch hardware, i.e. memory allocation and creation of data structures for simulated TSMs and regional processors (RPS) controlling them. In addition, the hardware configuration module 1230-2 sends the configuration information to switch hardware system 1201 using calls to the Erlang API 1202 (through the C/Erlang I/F 1202-1) [see FIG. 11 and FIG. 11]. TSMR signal interface 1230-3 is a function for handling CP-RP program signals sent between TSMR simulator 1230-5 and simulated central processor 1234.

CLTR signal interface 1230-4 is a function for handling CPRP program signals sent between the CLTR simulator 1230-8 and simulated central processor 1234. TSMR simulator 1230-5 is a function for emulating necessary elements of the TSMR regional software.

TSMR simulator 1230-5 is a function for emulating necessary elements of the TSMR regional software.

Path simulator 1230-7 is a function for analyzing paths in the translator 1230-9 by propagating in-band signals through these paths.

CLTR simulator 1230-8 is a function emulating basic elements of the CLTR regional software, such as maintaining the state of CLMS.

For the embodiment of FIG. 5C in which line interface boards (LIBs) 1300C are connected to switch hardware system 1201, the actual mapping of line-to-time slot on the PCM channel will not necessarily be identical to the mapping that the simulated central processor 1234 has set up for the simulated TSW which is included in module EMRP signaling simulator (EMRPSS) 1210. To resolve such situation, TSMR simulator 1230-5 will get a TSW mapping from TSW map element 1212 and use it to translate group switch orders from simulated central processor 1234.

In an actual (non-simulated) telecommunications group switch, switching is performed by writing to TSM memory. As explained hereinafter, the simulated group switch subsystem (SGS) 1230 of the semi-simulation system 1200 includes translator 1230-9 which translates instructions for writing to TSM memory to commands which are issued to switch hardware system.

3.0 Operation of Inventive Exchanges

In operation, the exchange main processor 1200 executes a first language (e.g., C language) simulation program which causes exchange main processor 1200 to emulate portions of a conventional group switch-employing telecommunications exchange. Specifically, the simulation program causes exchange main processor 1200 to emulate (among other processors and subsystems) the central processor 34 of a conventional exchange. Advantageously, the simulated central processor 1234 executes instructions coded for the central processor of the conventional exchange, thereby allowing reuse of the complex logic of operating systems of the conventional exchange. In so doing, simulated central processor 1234 presumes that the exchange it administers has a group switch. However, rather than having a group switch (which may be considerably larger and more expensive than required or afforded), the exchange has the switching device 1201 described above.

In order to accommodate both the simulated central processor 1234 (which advantageously reuses logic coded in the instruction set of a conventional exchange) and a non-group switch type switching device such as switching device 1201 of the present invention, adaptations in the form of interfaces and translators are provided by the exchange main processor 1200.

3.1 Configuration Set-Up

Two types of basic configuration operations are necessary for the telecommunications exchanges of FIG. 5A, FIG. 5B, and FIG. 5C. One type of configuration is configuration of switching device 1201. A second type of configuration is configuration of the TSMR simulator 1230-5.

Switching device 1201 may be flexible so as to handle connections of varying parameters, e.g., rates. Such being the case, switching device 1201 expects that an outside party configure switching device 1201 by specifying the parameters (e.g., rates) of connections being routed through switching device 1201. These parameters are passed to switching device 1201 in the manner understood below using configuration commands inputted to the command dispatcher (see FIG. 11).

As indicated above, exchange main processor 1200 provides simulated group switch subsystem (SGS) 1230 which emulates an actual group switch. Although a group switch per se is not utilized (but rather switching device 1201 instead), the simulated group switch subsystem (SGS) 1230 must nevertheless know various characteristics and structure of the group switch which it is supposed to emulate. For example, with reference to FIG. 4, for example, TSMR simulator 1230-5 of simulated group switch subsystem (SGS) 1230 must know the number of regional processors involved, the addresses for such regional processors, the size of the emulated group switch (e.g., the number and relation of its space switch modules (SPMs) to its time switch modules (TSMs) [see, e.g., FIG. 3 and FIG. 4]. Moreover, upon set up the memory configuration of the simulated group switch subsystem (SGS) 1230 in TSMR simulator 1230-5 must be initialized (to reflect disconnection throughout, i.e., that no connections have yet been made). In essence, configuring TSMR simulator 1230-5 of simulated group switch subsystem (SGS) 1230 is analogous to building the physical aspects of a group switch core.

The configuration data necessary for both types of basic configuration operations is inputted to simulated group switch subsystem (SGS) 1230 using configuration commands. The configuration commands are entered through the command dispatcher (see FIG. 11), and are passed to the command interpreter 1230-1 of simulated group switch subsystem (SGS) 1230. When the commands are interpreted by command interpreter 1230-1 as configuration commands, the configuration messages are sent to hardware configuration module 1230-2.

Hardware configuration module 1230-2 sends configuration messages indicative of the structure and characteristics of the emulated group switch to TSMR simulator 1230-5. Configuration messages necessary for set up of the switching device 1201 are routed to switching device 1201 by hardware configuration module 1230-2.

The use of command dispatcher, command interpreter, and hardware configuration module 1230-2 has been described in basic terms above for configuration purposes. It will be appreciated that by analogous action but by differing commands and messages the configuration of the emulated group switch, e.g., of TSMR simulator 1230-5, can be changed. Such changes can occur, for example, when a different type or different model of switching device 1201 is substituted for a previous switch device.

3.2 Making and Tearing Down Connections

An attempt to set up a connection through the exchanges of the embodiments of the invention is initiated with a proper connection signal incoming from an access unit 1202.

3.2.1 Signal Handling

The connection signal requesting connection set up (e.g., off-hook signal) is received at a port 1201-4 of switching device 1201. The connection signal requesting connection set up is routed through a signal channel (i.e., signal pipe) of switch logic 1201-2 to signal terminal 1201-1 using common channel signaling system number 7. In a protocol sense, in the embodiment of FIG. 5A the connection signal is terminated at signal terminal 1201-1, and is converted to a CP/RP program signal. The CP/RP program signal produced at signal terminal 1201-1 by the conversion is in the Erlang language, and therefore must be converted to C language for use by exchange main processor 1200. Therefore, CP/RP program signal produced at signal terminal 1201-1 travels through interface 1233 as shown in FIG. 8, e.g., traveling through both Erlang API 1233-2 and C/Erlang interface 1233-1.

In exchange main processor 1200A of the embodiment of FIG. 5A, for example, the CP/RP program signal corresponding to the connection signal requesting connection set up is handled by STC simulation module 1238, in the manner of STC 38 (see FIG. 1C) which they emulate, and fowarded to simulated central processor 1234. The simulated central processor 1234 then determines how to set up the connection through the group switch which simulated central processor 1234 thinks forms part of the telecommunications exchange . Upon such determination, simulated central processor 1234 sends a CP/RP programming signal to simulated group switch subsystem (SGS) 1230 to implement the determined connection path through the group switch. As explained below, however, the CP/RP program signal for implementing the determined connection path through the group switch in reality is translated to set up the connection through switching device 1201.

3.2.1 Connections Through The Switch

As indicated above, simulated central processor 1234 determines how to set up the connection through a group switch, since simulated central processor 1234 thinks that it is controlling a group switch. The path to be set up through the group switch is for connecting two subscribers, e.g., sub-A and sub-B. After making such determination, as illustrated in FIG. 13 simulated central processor 1234 sends a series of switch control messages 13C to simulated group switch subsystem (SGS) 1230, particularly initially to TSMR signal interface 1230-3 and eventually to TSMR simulator 1230-5. The switch control messages are in the form of CP/RP program signals.

The switch control messages generated by simulated central processor 1234 are essentially instructions for writing to control stores of appropriate time switch modules. For example, switch control messages 13C-1 through 13C-4 are for establishing a connection from subscriber sub-A to subscriber sub-B; switch control messages 13C-5 through 13C-8 are for establishing a connection from subscriber sub-B to subscriber sub-A.

In particular, for establishing the connection from subscriber sub-A to subscriber sub-B, switch control message 13C-1 writes to an appropriate time slot in control store CSA for the TSM to which subscriber sub-A belongs. Switch control message 13C-2 writes to the space switch module CSC for the TSM to which subscriber sub-A belongs. Switch control message 13C-3 writes to an appropriate time slot in control store CSB for the TSM to which subscriber sub-B belongs. Switch control message 13C-4 writes to the space switch module CSC for the TSM to which subscriber sub-B belongs.

For establishing the connection from subscriber sub-B to subscriber sub-A, switch control message 13C-5 writes to an appropriate time slot in control store CSA for the TSM to which subscriber sub-B belongs. Switch control message 13C-6 writes to the space switch module CSC for the TSM to which subscriber sub-B belongs. Switch control message 13C-7 writes to an appropriate time slot in control store CSB for the TSM to which subscriber sub-A belongs. Switch control message 13C-8 writes to the space switch module CSC for the TSM to which subscriber sub-A belongs.

TSMR signal interface 1230-3 (see FIG. 11) corresponds to a portion of group switch regional processor (GSRP) 32 which communicates with central processor 34 [see FIG. 1A]. When ones of the switch control messages 13C is detected by T SMR signal interface 1230-3, the TSMR signal interface 1230-3 routes such switch control message as a corresponding one of messages 131 to TSMR simulator 1230-5 (see FIG. 11). TSMR simulator 1230-5 corresponds both to the remainder of group switch regional processor (GSRP) 32 and time switch modules (TSM) 72 of a conventional group switch (see, e.g., FIG. 1A).

TSMR simulator 1230-5 knows that simulated central processor 1234 is not really controlling a group switch, but instead another kind of switching device. Therefore, TSMR simulator 1230-5 sends its versions of the switch control messages (denoted as messages 13S) to translator 1230-9.

At this juncture, the switch control messages are still understood as being write commands to control stores for time switch modules of a group switch (e.g., a switch of the T-S-T type). Translator 1230-9 receives these switch control messages (now represented as messages 13S) and prepares appropriate switch control messages which will be understood by switching device 1201, particularly switch logic 1201-2 of switching device 1201.

Connections within switch logic 1201-2 of switching device 1201 are set up by a series of Erlang language function calls, particularly a series of CREATE function calls which have an argument list which includes the following: CONNECTION, {PARENT_ORIGINATING, PARENT_TERMINATING}. The CONNECTION argument refers to the fact that a connection is being created. The PARENT_ORIGINATING argument refers to the connection pipe of the calling subscriber (sub-A); the PARENT_TERMINATING argument refers to the connection pipe of the called subscriber (sub-B).

With reference the switch logic 1201-2 of switching device 1201 as shown in FIG. 6, the connection pipe of each subscriber involved is identified by four fields: global address field 1201-128 points to the loop in which a switchboard serving the subscriber is located; intermediate address field 1201-127 points to the particular switchboard serving the subscriber; local address field 1201-126 points to a particular PCM link or connection pipe serving the subscriber; descriptor pointer 1201-125 is a time slot assigned to the subscriber on the PCM link.

In order to make the translation from switch control messages for a group switch to switch control messages for switching device 1201, translator 1230-9 maps the control store information of the simulated group switch to the four address fields utilized by switch logic 1201-2. In so doing, translator 1230-9 uses the identity of the space switch module addressed by the CSC write messages to ascertain a switchboard address of a switchboard serving the subscriber, i.e., the value of the intermediate address field 1201-127. The location of the particular space switch module (SPM) referenced by the CSC write message is used to determine to what loop of switch logic 1201-2 the subscriber belongs, i.e., the global address field 1201-128 by which the subscriber can be addressed. For example, with reference to FIG. 4 for example, if the particular space switch module (SPM) referenced by the CSC write message were on a first row of the SPM matrix, translator 1230-9 might know that the subscriber's switchboard is in a first loop of switch logic 1201-2, for example. The value written to the non-CSC control store (e.g., CSB) is indicative of the particular PCM link serving the subscriber, e.g., the local address field 1201-126 which points to a particular PCM link (i.e., connection pipe) in switch logic 1201-2 serving the subscriber. The translator 1230-9 determines the time slot value to use for time slot descriptor pointer 1201-125 by referring to the particular position or time slot within the control store for the particular PCM link which is affected by the switch control message.

Upon making the translation in the manner indicated above, as shown in FIG. 13 function calls 13F are made by translator 1230-9 to switching device 1201. The function calls are Erlang CREATE function calls having the CONNECTION and {PARENT_ORIGINATING, PARENT_

TERMINATING} argumens described above. For each of the PARENT_ORIGINATING and PARENT_TERMINATING arguments, i.e., for each of subscriber sub-A and subscriber sub-B, the four address fields described above are provided (global address field 1201-128; intermediate address field 1201-127; local address field 1201-126; and time slot descriptor pointer 1201-125).

The translator 1230-9 thus performs a language translation from the C language (which is predominately utilized by exchange main processor 1200) into the Erlang language utilized by switching device 1201. In this regard, the translator 1230-9 actually has functionality which serves as C/Erlang interface 1233-1 for such function calls.

Upon receipt of the CREATE function calls 13F, switch logic 1201-2 of switching device 1201 makes the connections through switching device 1201. The connections through switching device 1201 can conversely be broken down by appropriate switch control messages issued by simulated central processor 1234. In similar manner with the switch control messages which set up connections, the switch control messages which tear down the connections are routed to translator 1230-9 so that a comparable mapping can be made. When a connection is to be torn down, an Erlang language RELEASE function call is made by translator 1230-9 to switching device 1201.

4.0 Incremental Translation

As indicated above, in order to capitalize upon the well-developed logic of conventional group switch-utilizing exchanges, the simulated central processor 1234 receives its instructions coded with the instruction set of a group switch-utilizing exchange operating system (e.g., the APZ operating system in the illustrated examples). The APZ-coded instructions utilized by the simulated central processor 1234 are translated by exchange main processor 1200 to instructions which exchange main processor 1200 can execute, in particular to machine language instructions of exchange main processor 1200.

An incremental translation technique is employed by exchange main processor 1200 for translating instructions coded with the instruction set of a group switch-utilizing exchange operating system to machine language instructions of exchange main processor 1200. This incremental translation technique is described in U.S. patent application Ser. No. 08/874,660, filed Jun. 13, 1997 and entitled "SIMULATION OF COMPUTER PROCESSOR", which is incorporated herein by reference. A brief summary of incremental translation is provided below.

As schematically depicted in FIG. 7, RAM 130 includes a number of routines and area (e.g., sections or tables). For example, target object code area 132, also known as the target instruction memory, is used to store programmed instructions coded for the simulated central processor 1234. The target instructions (e.g., APZ instructions in the illustrated embodiment) stored in target object code area 132 of RAM 130 are typically obtained from an external storage media (e.g., via I/O storage device 120) and transferred as necessary, e.g., cached, into RAM 130. Thus, the target instructions are formatted in accordance with the instruction set of the simulated central processor 1234. The target instructions stored in target object code area 132 are intended to cause simulated central processor 1234 to perform its emulation of portions of group switch-based telecommunications exchanges of the illustrated embodiments. However, the target instructions stored in target object code area 132 are instead translated by exchange main processor 1200 into instructions which exchange main processor 1200 can understand (e.g., Intel Pentium machine language instructions) for performing the emulation.

Also included in RAM 130 are various programmed routines executed by exchange main processor 1200, including an emulation/simulation supervisory routine (FSR) 133; decoding routine 134; translation routine 135; and, emulation execution routine 136. In addition RAM 130 has stored therein a jump table 140 and an emulation instruction storage area 142.

Figure 12:
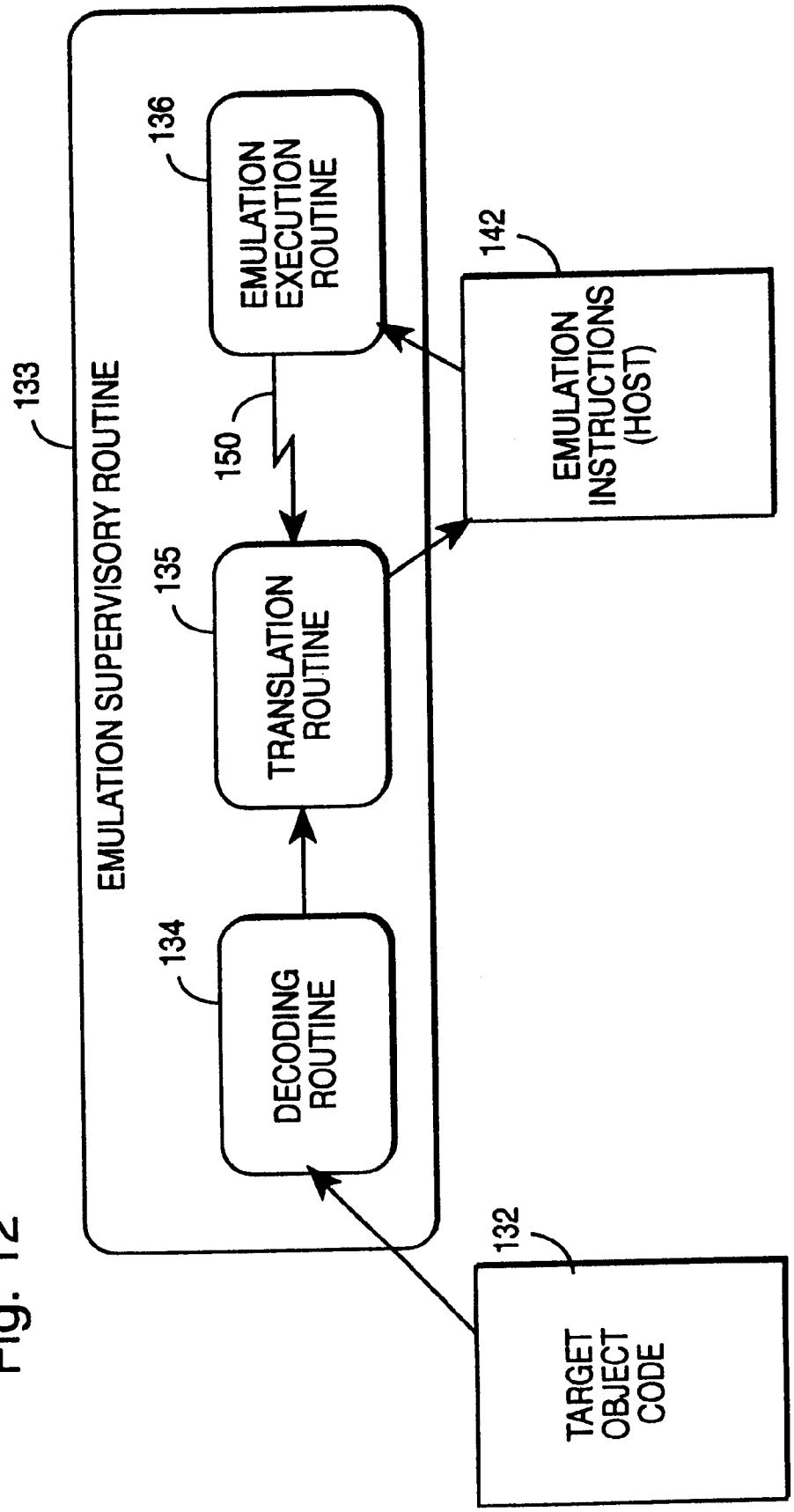
FIG. 12 is a diagrammatic view showing pipelined or incremental coordination by a emulation supervisory routine of translation of target object code to emulated instructions and of execution of the emulated instructions.

FIG. 12 shows how emulation supervisory routine coordinates pipelined or incremental performance of translation of target object code (e.g. APZ code executable by simulated central processor 1234) to emulated instructions and execution by the exchange main processor 1200. In brief, when emulation supervisory routine 133 determines that it is time to fetch target instructions from target object code area 132, the fetched target instructions are analyzed by decoding routine 134. Decoding routine 134, knowing the structure of the target instruction set, picks apart a fetched target instruction and determines its type, e.g., whether the fetched instruction is an "add register" instruction for adding the contents of two registers, a "move" instruction for moving the contents of one register into another register or address, etc. The analysis of the fetched target instruction is premised upon understanding by decoding routine 134 of the pre-defined operation codes and fields of the target instruction sets. With the benefit of the analysis performed by decoding routine 134, translation routine 135 builds a set of emulation instructions for storage in emulation instruction area 142. The emulation instructions stored in area 142 are formatted in the instruction set of exchange main processor 1200. The emulation instructions generated for the fetched target instruction are configured to cause 1200 to perform the same actions as would the target processor upon executing the fetched target instruction. Emulation execution routine 136 obtains the emulation instructions from area 142 for execution by exchange main processor 1200. When emulation execution routine 136 determines that more emulation instructions are necessary for filling in emulation instruction storage area 142, an interrupt is generated to translation routine 135 as shown by line 150 in FIG. 12. In response to the interrupt, more target instructions are fetched, decoded, and translated for supply to emulation instruction storage area 142.

5.0 Epilog

It should be understood that the telecommunications exchanges of the present invention can function as any type of telecommunications node. For example, the telecommunications exchanges of the present invention can be employed as local exchanges, transit exchanges, and even in nodes of an intelligent network (e.g., service switching points [SSPs] and service control points [SCPs]). Further, the telecommunications exchanges of the present invention can be included in nodes of a cellular telecommunications network, such as base station controller nodes, and mobile switching center nodes, and even in home location registers and visiting location register nodes.

The access units 1202A, 1202B of the embodiments of FIG. 5A and FIG. 5B, respectively, can be connected to lines providing differing types of service, e.g., POTS, ISDN, for example.

While the illustrated embodiments have shown the exchange main processor 1200 and switching device 1201 as utilizing differing programming languages (e.g., C and Erlang, respectively), it should be understood that yet other programming languages may be used by either, or that exchange main processor 1200 and switching device 1201 may use the same programming language.

Moreover, whereas the simulation of portions of a group switch-based telecommunications exchange has been illustrated as solely performed by exchange main processor 1200 in one programming language, it should be understood that such simulation functions can instead be distributed among two or more languages on the same or differing processors. For example, some of the simulation may be performed by processor(s) of switching device 1201, e.g., in the Erlang language. In such case, a change of location of any language interface, e.g., C/Erlang interface 1233-1, should be made accordingly.

In the illustrated embodiments, for clarity exchange main processor 1200 has been shown as being external to switching device 1201. It should be understood that in other embodiments that exchange main processor 1200, or functions performed thereby, may instead be located in switching device 1201, e.g., on a board in switching device 1201. In other words, some or all of the semi-simulation functions performed by exchange main processor 1200 can be included in switching device 1201.

Advantageously, the telecommunications exchanges of the present invention utilize open platform, industry standard, commercially available processors and yet capitalize upon the logic coded for customized embedded processors traditionally employed in group switch-utilizing telecommunications exchanges.

Moreover, the constituent units of the telecommunications exchanges of the present invention—exchange main processor 1200, switching device 1201, and the access units 1202—need not all be provided by the same vendor.

Although preferably the exchange main processor 1200 of the telecommunications exchanges of the present invention is a single processor, the invention is not so limited. Rather, the operations of exchange main processor 1200 as described herein can be distributed to multiple processors if desired.

The present invention allows a telecommunications operator or service provider to install a relative smaller and less expensive telecommunications exchange in a location which otherwise might not require the capacity and/or justify the cost of a larger group switch-based telecommunications exchange. Yet requirements and/or economics change so that utilization of a group switch becomes justified, e.g., there is a need to serve more subscribers or connections. In such cases, the exchange main processor 1200 and switching device 1201 are replaced with comparable physical group switch components such as those shown in FIG. 1A and FIG. 1B. However, in such a situation, the access units 1202 previously employed by the exchange can remain. Retention of access units 1202 during such upgrade is extremely advantageous, since the access units 1202 represent a substantial cost of the entire telecommunications exchange.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A telecommunications exchange node comprising:
    a switching device of a first type through which telecommunications connections are routed between two actual subscribers;
    an access unit for connecting the switching device to a telecommunications network; and
    an exchange main processor which uses switch operation logic of a switching device of a second type for generating switch control messages for the switching device of the second type as if the switching device of the second type were to be used for a connection between the actual subscribers, but which translates the switch control messages for use by the switching device of the first type, the switching device of the first type having a switch operation logic which differs from the switch operation logic of the switching device of the second type.

2. The apparatus of claim 1, wherein the exchange main processor emulates portions of a telecommunications exchange which interface with the switching device of the first type.

3. The apparatus of claim 2, wherein the portions of a telecommunications exchange emulated by the exchange main processor include a central processor.

4. The apparatus of claim 3, wherein in emulating the central processor the exchange main processor translates coded instructions executable by the central processor into instructions executable by exchange main processor.

5. The apparatus of claim 4, wherein the exchange main processor performs an incremental translation of coded instructions executable by the central processor into instructions executable by exchange main processor.

6. The apparatus of claim 2, wherein the portions of a telecommunications exchange emulated by the exchange main processor include a central processor, at least one regional processor, and subsystem of the switching device of the second type.

7. The apparatus of claim 1, wherein the exchange main processor executes instructions of a first programming language and the switching device of the first type executes instructions of a second programming language, and further comprising an interface between the exchange main processor and the switching device.

8. The apparatus of claim 1, wherein the switching device of the second type is a group switch.

9. The apparatus of claim 1, wherein the switching device of the first type is a packet-handling switch.

10. The apparatus of claim 1, wherein the switching device of the second type has a greater connection capacity than the switching device of the first type.

11. The apparatus of claim 1, wherein the telecommunications exchange node is one of a local exchange, a transit exchange, a node of an intelligent network, and a node of a cellular telecommunications network.

12. The apparatus of claim 1, wherein the access unit operates in conjunction with a standard interface.

13. The apparatus of claim 12, wherein the access unit operates in conjunction with an industry standard V5 interface.

14. The apparatus of claim 1, wherein the access unit comprises a line interface board.

15. The apparatus of claim 14, wherein the exchange main processor performs a local time switch mapping function.

16. The apparatus of claim 1, wherein the exchange main processor is an open platform processor.

17. The apparatus of claim 1, wherein the exchange main processor is external to the switching device.

18. The apparatus of claim 1, wherein the exchange main processor includes a translator which translates switch control messages for the switching device of a second type into switch control messages for use by the switching device of the first type.

19. The apparatus of claim 1, wherein the switch operation logic of the switching device of the second type is for a time-space-time switching device, and wherein the switch operation logic of the switching device of the first type is not for a time-space-time switching device.

20. The apparatus of claim 19, wherein the switching device of the second type is a group switch.

21. The apparatus of claim 19, wherein the switching device of the first type is a packet-handling switch.

22. The apparatus of claim 1, wherein the switching device of the second type and the switching device of the first type have different internal architecture.

23. The apparatus of claim 1, wherein the switching device of the second type and the switching device of the first type have different software instruction sets.

24. A program of executable steps stored in a memory for operating a telecommunications exchange node, the program being executable on a processor whereby the program uses switch operation logic of a switching device of a second type for generating switch control messages for the switching device of the second type as if the switching device of the second type were to be used for a connection between the actual subscribers, but which translates the switch control messages for use by the switching device of the first type, the switching device of the first type having a switch operation logic which differs from the switch operation logic of the switching device of the second type.

25. The program of claim 24, wherein the program emulates portions of a telecommunications exchange which interface with the switching device of the first type.

26. The program of claim 25, wherein the portions of a telecommunications exchange emulated by the exchange main processor include a central processor.

27. The program of claim 26, wherein in emulating the central processor the exchange main processor translates coded instructions executable by the central processor into instructions executable by exchange main processor.

28. The program of claim 25, wherein the portions of a telecommunications exchange emulated by the exchange main processor include a central processor, at least one regional processor, and subsystem of the switching device of the second type.

29. The program of claim 24, wherein the switching device of the second type is a group switch.

30. The program of claim 24, wherein the switching device of the first type is a packet-handling switch.

31. The program of claim 24, wherein the switching device of the second type has a greater connection capacity than the switching device of the first type.

32. The program of claim 24, wherein the telecommunications exchange node is one of a local exchange, a transit exchange, a node of an intelligent network, and a node of a cellular telecommunications network.

33. The program of claim 24, wherein the program is executable on an open platform processor.

34. The program of claim 24, wherein the switch operation logic of the switching device of the second type is for a time-space-time switching device, and wherein the switch operation logic of the switching device of the first type is not for a time-space-time switching device.

35. The program of claim 34, wherein the switching device of the second type is a group switch.

36. The program of claim 34, wherein the switching device of the first type is a packet-handling switch.

37. The program of claim 24, wherein the switching device of the second type and the switching device of the first type have different internal architecture.

38. The program of claim 24, wherein the switching device of the second type and the switching device of the first type have different software instruction sets.

39. A method of operating a telecommunications exchange node, the method comprising:

routing telecommunications connections between actual subscribers through a switching device of a first type in accordance with control messages for use by the switching device of the first type;

using an access unit to connect the switching device to a traffic-carrying telecommunications network;

employing at the node an exchange main processor which utilizes switch operation logic of a switching device of a second type to generate switch control messages for the switching device of the second type as if the switching device of the second type were to be used for routing the telecommunications connections between the actual subscribers, the switching device of the first type having a switch operation logic which differs from the switch operation logic of the switching device of the second type;

translating the switch control messages for use by the switching device of the first type.

40. The method of claim 39, wherein the exchange main processor emulates portions of a telecommunications exchange which interface with the switching device of the first type.

41. The method of claim 40, wherein the portions of a telecommunications exchange emulated by the exchange main processor include a central processor.

42. The method of claim 41, wherein in emulating the central processor the exchange main processor translates coded instructions executable by the central processor into instructions executable by exchange main processor.

43. The method of claim 40, wherein the portions of a telecommunications exchange emulated by the exchange main processor include a central processor, at least one regional processor, and subsystem of the switching device of the second type.

44. The method of claim 40, wherein the switching device of the second type is a group switch.

45. The method of claim 40, wherein the switching device of the first type is a packet-handling switch.

46. The method of claim 40, wherein the translating of the switch control messages for use by the switching device of the first type is performed by the exchange main processor.

47. The method of claim 39, wherein the switch operation logic of the switching device of the second type is for a time-space-time switching device, and wherein the switch operation logic of the switching device of the first type is not for a time-space-time switching device.

48. The method of claim 47, wherein the switching device of the second type is a group switch.

49. The method of claim 47, wherein the switching device of the first type is a packet-handling switch.

50. The method of claim 39, wherein the switching device of the second type and the switching device of the first type have different internal architecture.

51. The method of claim 39, wherein the switching device of the second type and the switching device of the first type have different software instruction sets.

* * * * *